United States Patent
Choi et al.

(10) Patent No.: US 10,229,723 B1
(45) Date of Patent: Mar. 12, 2019

(54) SPIN ORBIT TORQUE MAGNETORESISTIVE RANDOM ACCESS MEMORY CONTAINING COMPOSITE SPIN HALL EFFECT LAYER INCLUDING BETA PHASE TUNGSTEN

(71) Applicant: SANDISK TECHNOLOGIES LLC, Plano, TX (US)

(72) Inventors: Young-Suk Choi, Los Gatos, CA (US); Brian York, San Jose, CA (US); Neil Smith, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/701,761

(22) Filed: Sep. 12, 2017

(51) Int. Cl.
| | |
|---|---|
| *G11C 11/22* | (2006.01) |
| *G11C 11/16* | (2006.01) |
| *G11C 11/18* | (2006.01) |
| *H01L 43/10* | (2006.01) |
| *H01L 43/06* | (2006.01) |
| *H01L 43/04* | (2006.01) |
| *H01L 43/08* | (2006.01) |

(52) U.S. Cl.
CPC ........ *G11C 11/161* (2013.01); *G11C 11/1673* (2013.01); *G11C 11/1675* (2013.01); *G11C 11/18* (2013.01); *H01L 43/04* (2013.01); *H01L 43/06* (2013.01); *H01L 43/08* (2013.01); *H01L 43/10* (2013.01)

(58) Field of Classification Search
CPC .......................... G11C 11/161; G11C 11/1673; G11C 11/1675
USPC ........................................ 365/145, 148, 153
See application file for complete search history.

(56) References Cited

U.S. PATENT DOCUMENTS

| | | | |
|---|---|---|---|
| 8,963,222 B2 * | 2/2015 | Guo | H01L 43/04 257/295 |
| 2010/0027330 A1 | 2/2010 | Koo et al. | |
| 2014/0001524 A1 | 1/2014 | Manipatruni et al. | |
| 2014/0211552 A1 | 7/2014 | Pi et al. | |

(Continued)

FOREIGN PATENT DOCUMENTS

WO   WO2016209226 A1   12/2016

OTHER PUBLICATIONS

Liu, X. et al., "Ferromagnetic Resonance and Damping Properties of CoFeB Thin films as Free Layers in MgO-Based Magnetic Tunnel Junctions," Journal of Applied Physics, vol. 110, pp. 033910-1 to 033910-5, (2011).

(Continued)

*Primary Examiner* — Vu Le
(74) *Attorney, Agent, or Firm* — The Marbury Law Group PLLC

(57) ABSTRACT

A spin orbit torque magnetoresistive random access memory (SOT MRAM) cell includes a magnetic tunnel junction that contains a free layer having two bi-stable magnetization directions, a reference magnetic layer having a fixed magnetization direction, and a tunnel barrier layer located between the free layer and the reference layer, and a non-magnetic spin Hall effect layer. The spin Hall effect layer may include an alternating stack of beta phase tungsten layers and noble metal nonmagnetic dusting layers. Alternatively or in addition, a hafnium layer may be located between the nonmagnetic spin Hall effect layer and the free layer.

17 Claims, 21 Drawing Sheets

(56) References Cited

U.S. PATENT DOCUMENTS

| | | | |
|---|---|---|---|
| 2014/0252439 A1* | 9/2014 | Guo | G11C 11/18 |
| | | | 257/295 |
| 2014/0264511 A1 | 9/2014 | De Brosse et al. | |
| 2016/0300999 A1 | 10/2016 | Yi et al. | |
| 2017/0117027 A1 | 4/2017 | Braganca et al. | |
| 2017/0117323 A1 | 4/2017 | Braganca et al. | |
| 2017/0125078 A1* | 5/2017 | Mihajlovic | G11C 11/161 |
| 2017/0200884 A1 | 7/2017 | Oguz et al. | |
| 2018/0033954 A1* | 2/2018 | Aradhya | H01L 43/06 |

OTHER PUBLICATIONS

International Search Report and Written Opinion of the International Search Authority for International Patent Application No. PCTUS2018/035136, dated Aug. 13, 2018, 18 pages.

* cited by examiner

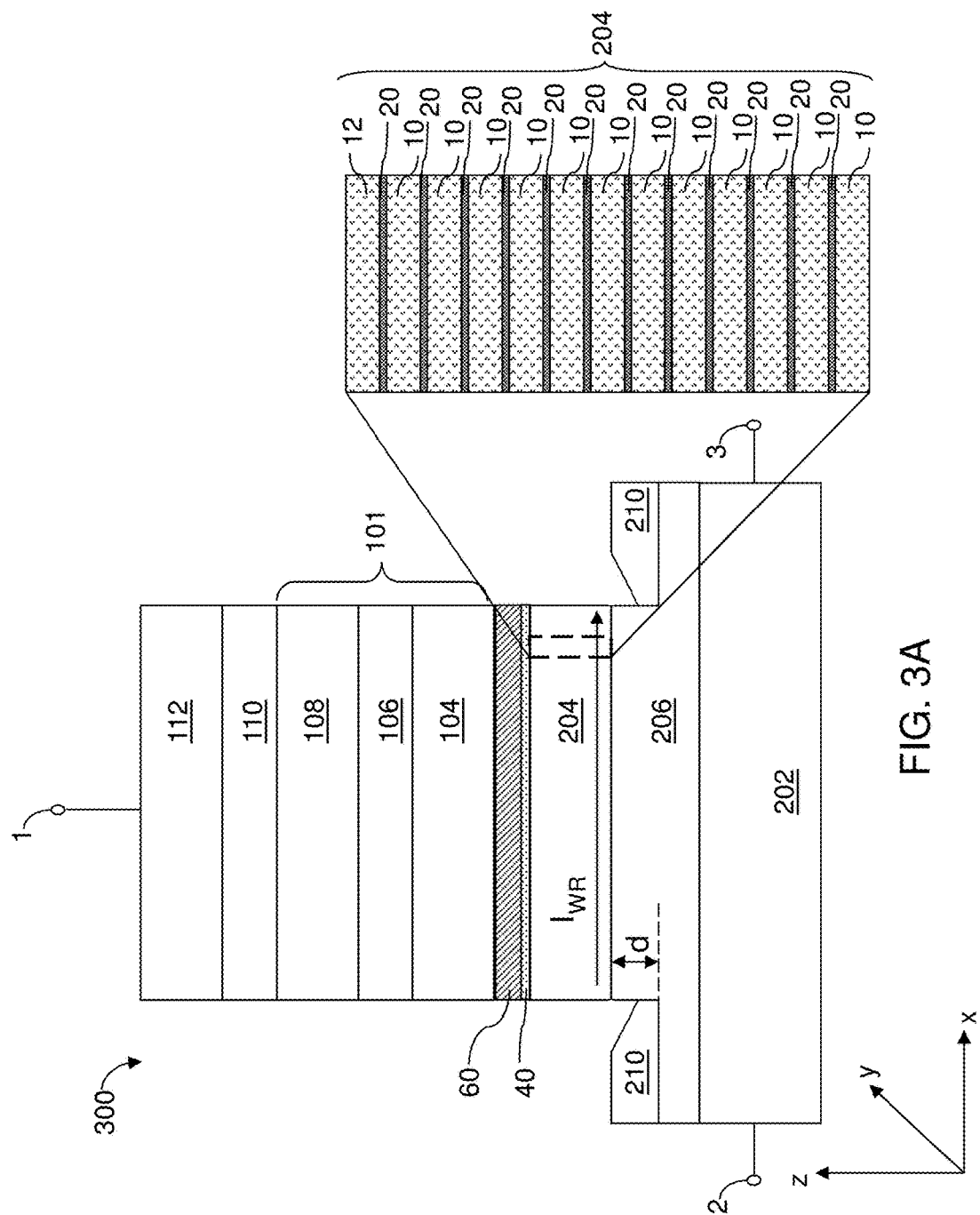

SPIN ORBIT TORQUE MAGNETORESISTIVE RANDOM ACCESS MEMORY CONTAINING COMPOSITE SPIN HALL EFFECT LAYER INCLUDING BETA PHASE TUNGSTEN

FIELD

The present disclosure relates generally to the field of magnetic storage elements, and particularly to spin orbit torque (SOT) magnetoresistive memory cells.

BACKGROUND

Magnetoresistive random access memory (MRAM) is a non-volatile random-access memory technology. Unlike conventional random access memory (RAM), data in MRAM devices are not stored as electric charge or current flows. Instead, data is stored by magnetic storage elements. MRAM devices include cells or elements having a magnetically hard layer (i.e., a "reference" layer) and a magnetically soft layer (i.e., the "free" layer). Writing to MRAM is performed by passing current through current leads that are formed on either side of each memory element in order to create a local induced magnetic field, which sets the direction of the soft layer magnetization. Significant problems arise when scaling these devices to high densities. Particularly, the currents required to generate sufficient field to switch the free layer become prohibitively large, and disturbances to neighboring cells or elements can occur during writing, which in turn may cause a neighboring cell to be erroneously written.

Spin transfer torque (STT) MRAM devices are similar to conventional MRAM devices except that the write current paths pass through the magnetic layers of each memory element. The free layer is set via the spin transfer torque from the spin polarized current passing through the reference magnetic layer. Spin orbit torque (SOT) MRAM devices are similar to spin transfer torque (STT) MRAM devices except that the read and write paths are independent. Because the write current does not pass through the thin tunnel barrier layer, SOT MRAM devices can have better endurance. Recent designs for SOT MRAM devices are disclosed, for example, in U.S. Patent Application Publication No. 2017/0125078.

SUMMARY

According to an aspect of the present disclosure, a spin orbit torque magnetoresistive random access memory (SOT MRAM) cell includes a magnetic tunnel junction that contains a free layer having two bi-stable magnetization directions, a reference magnetic layer having a fixed magnetization direction, and a tunnel barrier layer located between the free layer and the reference layer, and a nonmagnetic spin Hall effect layer. In one embodiment, the spin Hall effect layer may include an alternating stack of beta phase tungsten layers and noble metal nonmagnetic dusting layers. In another embodiment, a hafnium layer may be located between the nonmagnetic spin Hall effect layer and the free layer.

BRIEF DESCRIPTION OF THE DRAWINGS

FIG. 3A illustrates a third exemplary structure including an SOT-MRAM device according to an embodiment of the present disclosure.

DETAILED DESCRIPTION

As discussed above, the present disclosure is directed to spin orbit torque (SOT) magnetoresistive memory cells, a random access memory device employing the same, and methods of manufacturing the same, the various aspects of which are described below. The embodiments of the disclosure can be employed to form various semiconductor devices such as three-dimensional memory array devices comprising MRAM devices. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

Figure 1A:
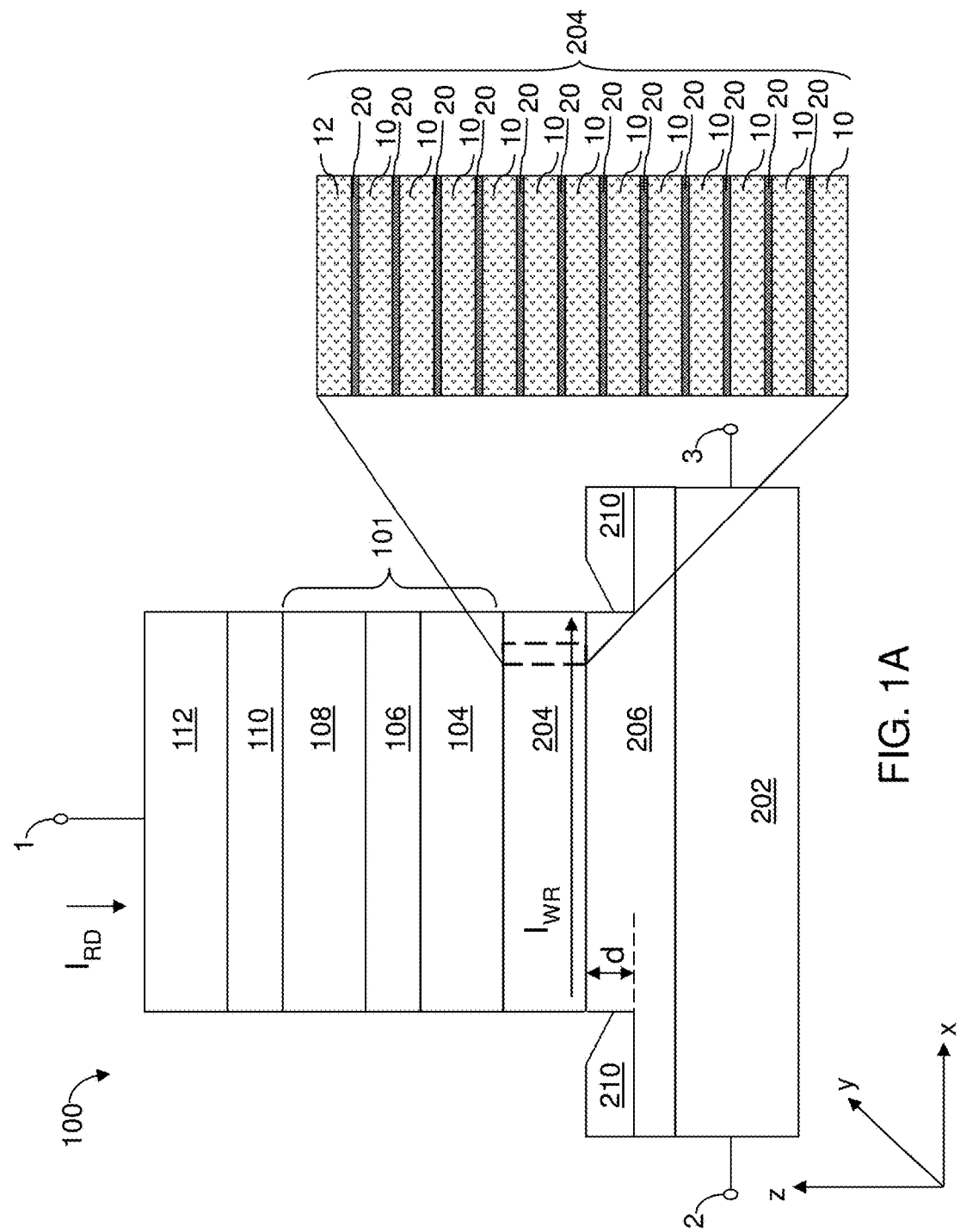
FIG. 1A illustrates a first exemplary structure including an SOT-MRAM device according to an embodiment of the present disclosure.
Figure 1B:
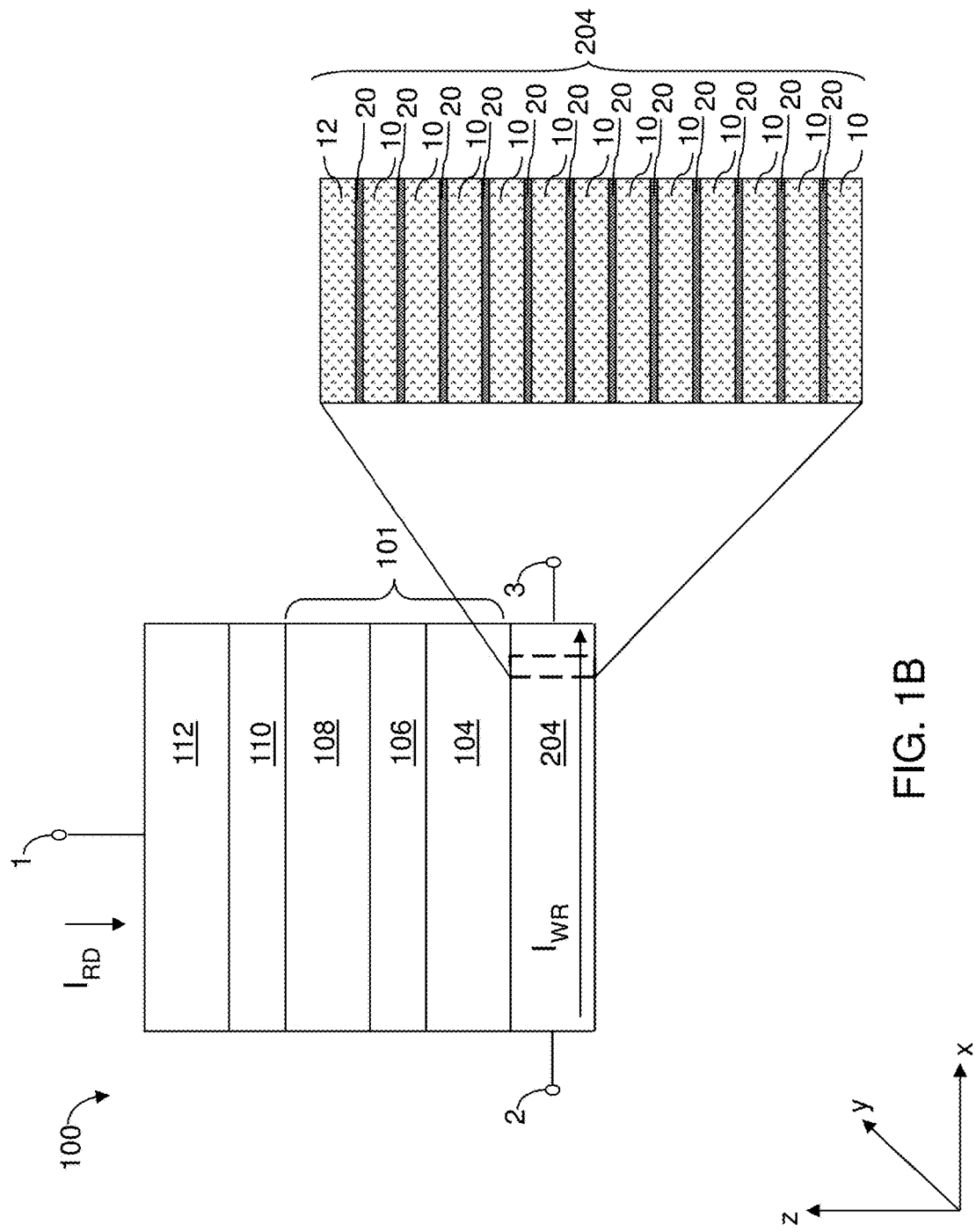
FIG. 1B illustrates an alternative embodiment of the first exemplary structure including an SOT-MRAM device according to an embodiment of the present disclosure.

Referring to FIGS. 1A and 1B, embodiments of a first exemplary spin orbit torque (SOT) magnetoresistive memory cell 100 according to an embodiment of the present disclosure are illustrated. The first exemplary SOT magnetoresistive memory cell 100 includes a layer stack, from bottom to top, of an optional antiferromagnetic (AFM) layer 202, an optional ferromagnetic bias layer 206, a nonmagnetic spin Hall effect layer (also known as a SOT layer) 204, a free layer 104, a tunnel barrier layer 106 (e.g., a MgO layer), a reference layer 108, an antiparallel coupling layer 110, and a hard magnet layer 112. The SOT magnetoresistive memory cells is a three-terminal device including a first terminal 1 electrically connected to the hard magnet layer 112, a second terminal 2 electrically connected to one end of the AFM layer 202, and a third terminal 3 electrically connected to another end of the AFM layer 202.

The magnetization of the hard magnetic layer 112 maintains a fixed orientation perpendicular to the plane or parallel to the plane. In one embodiment, the magnetization of the hard magnetic layer 112 may be an "up" direction or a "down" direction due to strong perpendicular magnetic anisotropy (PMA) in a first configuration illustrated in FIG. 1A. In another embodiment, the magnetization of the hard magnetic layer 112 may be along a horizontal direction (i.e., parallel to the interface between the hard magnetic layer 112 and the antiparallel coupling layer 110) due to strong in-plane magnetic anisotropy (IMA) as illustrated in a second configuration illustrated in FIG. 1B. The magnetization of the reference layer 108 is coupled to the magnetization of the hard magnetic layer 112 via strong antiparallel coupling (AP) provided by the antiparallel coupling layer 110. Thus, the magnetization of the reference layer 108 is antiparallel to the magnetization of the hard magnetic layer 112. For example, if the hard magnetic layer 112 has an "up" magnetization, the reference layer 108 can have a "down" magnetization, and vice versa. If the hard magnetic layer 112 has a horizontal magnetization, the reference layer 108 can have a horizontal magnetization of the opposite direction. The antiparallel coupling layer 110 can include, for example, ruthenium.

The free layer 104 (e.g., a CoFeB and/or CoFe layer) has primarily two bi-stable magnetization directions. The free layer 104 may a vertical easy axis of magnetization due to perpendicular magnetic anisotropy of sufficient strength, or may have a horizontal easy axis of magnetization due to in-plane magnetic anisotropy of sufficient strength. The magnetization of the free layer 104 is nominally kept along an easy axis of magnetization (such as the z-axis or the x-axis), but its direction can be switched between two states: parallel or antiparallel to the reference layer 108, in response to the spin orbit torque (SOT) generated by passing a write current $I_{WR}$ through the nonmagnetic spin Hall effect layer 204. The spin Hall effect is a transport phenomenon in a nonmagnetic conductor consisting of the generation of spin current flow in a direction perpendicular to the plane defined by electrical current direction and that of the spin polarization direction. In an illustrative case, if the magnetization of the reference layer 108 is in the "up" direction, the magnetization of the free layer 104 points in the upward z-direction in the parallel state, and points in the downward z-direction in the antiparallel state. If the magnetization of the reference layer 108 is in the positive x-axis direction, the magnetization of the free layer 104 points in the positive x-axis direction in the parallel state, and points in the negative x-axis direction in the antiparallel state. The two states of magnetization of the free layer 104 may correspond to logical states of 0 and 1. The layer stack of the reference layer 108, the tunnel barrier layer 106, and the free layer 104 constitutes a magnetic tunnel junction 101. Various additional non-magnetic layers, such as tantalum, tungsten and/or ruthenium may be formed as part of the magnetic tunnel junction The nonmagnetic spin Hall effect layer 204 is positioned beneath the free layer 104, and may be in contact with the free layer 104. According to an embodiment of the present disclosure, the spin Hall effect layer 204 includes a layer stack including multiple beta phase tungsten layers such that a significant volume fraction (such as more than 50%, more than 80%, and/or more than 90%) of beta phase tungsten is provided for electrical conduction of the write current $I_{WR}$.

The ferromagnetic bias layer 206, if present, is configured to provide a magnetic bias field on the free layer 104 to achieve deterministic switching. In the first configuration of FIG. 1A, the ferromagnetic bias layer 206 is configured to provide an in-plane magnetic bias field to the free layer 104 via its stray field, primarily along the x-axis, in order to achieve deterministic switching of the magnetization of the free layer 104. This can be achieved by partially milling the ferromagnetic bias layer 206 to a depth d, with respect to the spin Hall effect layer 204. The milling depth d, provides an additional variable for adjusting the strength of the stray magnetic field on the free layer 104. The milling depth may be anywhere between 0 nm and t nm, where t is the thickness of the ferromagnetic bias layer 206. Because the ferromagnetic bias layer 206 is configured to generate a magnetic bias field, it eliminates the need for permanent magnets (described with respect to FIGS. 7A-7C below), and simplifies the chip design for SOT-MRAM cells. The ferromagnetic bias layer 206 can be omitted in the second configuration illustrated in FIG. 1B in which the free layer 104 and the reference layer 108 have horizontal magnetization.

The AFM layer 202, if present, is configured to pin the magnetization direction of the ferromagnetic bias layer 206 in a pre-determined direction. For example, the AFM layer 202 can pin the magnetization direction of the ferromagnetic bias layer along the x direction via exchange bias. In one embodiment, the AFM layer 202 may be composed of an antiferromagnetic material. For example, the AFM layer 202 may comprise IrMn. The AFM layer 202 can be omitted in the second configuration illustrated in FIG. 1B in which the free layer 104 and the reference layer 108 have horizontal magnetization.

During sensing (i.e., reading) operation, a read current $I_{RD}$ may flow between terminal 1 and terminal 3 through the tunnel junction 101. During a programming (i.e., writing) operation, a write current $I_{WR}$ may flow between terminal 2 and terminal 3. A fraction of the write current $I_{WR}$ can flow up and into (and down and out of) the nonmagnetic spin Hall effect layer 204 when passing underneath to induce the transition of the magnetization of the free layer 104. The write current does not flow through the tunnel junction 101 to terminal 1. Thus, the read and write currents flow in different directions.

In the first configuration of FIG. 1A, due to the relatively high resistivity of most materials for the AFM layer 202 (such as IrMn), the Joule heating due to the write current flow in the extended regions of AFM layer 202 between adjacent memory cells may be problematic when running a high current density through the ferromagnetic bias layer 206. Additionally, it is desired that as large a fraction as possible of the write current flow through the nonmagnetic spin Hall effect layer 204 to maximize the switching current through the tunnel barrier layer 106. A patterned capping layer 210 may be deposited on the ferromagnetic bias layer 206 to cover most, if not all, of the ferromagnetic bias layer 206 in the extended regions between memory cells, getting as close as practical to the side walls of the nonmagnetic spin Hall effect layer 204 and the sidewalls of the ferromagnetic bias layer 206. The capping layer 210 can include a high conductivity material such as gold, copper, or silver.

Beta phase tungsten provides a spin Hall angle (SHA) of over 30%, and as such, is one of the most promising materials that provides spin Hall effect, under which pure spin current that switches the magnetization of the free layer is generated. The large spin Hall angle is a significant factor that lowers the switching current because the large spin Hall angle generates more spin current per the electrical current provided by a transistor to the nonmagnetic spin Hall effect layer 204. However, beta phase tungsten suffers from thermal instability and thickness instability. For example, beta phase tungsten can easily transform (e.g., recrystallize) into alpha phase tungsten upon anneal. Further, beta phase tungsten can spontaneously transform into alpha phase tungsten when the layer thickness exceeds 20 nm under typical growth conditions. In addition, reactive sputtering of tungsten suffers from lack of process reproducibility due to target poisoning. While a high pressure, low power deposition process for beta phase tungsten is available, this process generates beta phase tungsten with high surface roughness in excess of 3.5 nm in root mean square roughness, rendering the deposited material properties inferior for thin film applications such as spin Hall layer for an SOT magnetoresistive cell.

The critical switching current $J_c^{SOT}$ that is needed to induce change of magnetization in the free layer 104 has the following relationship: $J_c^{SOT} \propto M_s t_{FL} \alpha \beta_S^{eff}$ in which $M_s$ is the saturation magnetization of the free layer 104, $t_{FL}$ is the thickness of the free layer 104, $\alpha$ is a damping constant, and $B_S^{eff}$ is given by: $B_S^{eff} = 4\pi M_s - H_{k\perp}$, in which $H_{k\perp}$ is the effective (interfacial) perpendicular anisotropy field of the free layer 104. According to an aspect of the present disclosure, configurations for the combination of the beta phase tungsten layers and interface layer are provided, which are employed to reduce the various parameters that affect the critical switching current $J_c^{SOT}$.

According to an aspect of the present disclosure, a nonmagnetic spin Hall effect layer 204 comprising an alternating stack of beta phase tungsten layers 10 and nonmagnetic dusting layers 20 (i.e., thin nonmagnetic layers) is provided. In one embodiment, the nonmagnetic dusting layers 20 can comprise, or consist of, noble metal layers, such as noble metals with fcc or hcp unit cell structures, for example, ruthenium, platinum, iridium, palladium, rhodium, rhenium, and/or osmium layers. An optional beta phase tungsten cap layer 12 can be formed on the alternating stack (10, 20) between the alternating stack and the free layer 104. The cap layer 12 can have a thickness in a range from 0.5 nm to 1 nm.

In one embodiment, the alternating stack (10, 20) includes N periodic repetitions of a pair of a beta phase tungsten layer 10 and a nonmagnetic dusting layer 20, and wherein N is an integer in a range from 5 to 30, such as 5 to 15, for example 8 to 10. In this case, each beta phase tungsten layer 10 can have a same first thickness, and each nonmagnetic dusting layer 20 can have a same second thickness.

In one embodiment, each beta phase tungsten layer 10 can have a thickness of not greater than 2 nm, for example not greater than 1.2 nm, such as 0.2 nm to 1.2 nm, including 0.5 nm to 1 nm to ensure that the tungsten material deposited in beta phase during the deposition process remaining in the beta phase. The thickness of the beta phase tungsten layers 10 in the stack may be the same, or different from each other. Each of the nonmagnetic dusting layers 20 can have a thickness in a range from 0.1 nm to 0.3 nm (such as from 0.2 nm to 0.25 nm). Alternatively or additionally, the ratio of a thickness of the beta phase tungsten layer 10 within each pair to the thickness of the nonmagnetic dusting layer 20 within the pair can be in a range from 3 to 6, such as 4 to 5 (i.e., a ratio of 1 nm thick tungsten layer to a 0.2 nm thick dusting layer is 5).

As discussed above, beta phase tungsten tends to change out of the beta phase into the alpha phase as the film thickness increases. The laminated multilayer structure of the alternating stack (10, 20) with the nonmagnetic dusting layers 20 of noble metal, such as ruthenium or platinum, breaks the physical continuity of the beta phase tungsten material 10 along the z-direction perpendicular to the interfaces within the alternating stack (10, 20). The nonmagnetic dusting layer 20 provides the function of stabilizing the beta phase of adjoining beta phase tungsten layers 10. The thickness of the beta phase tungsten layers 10 does not exceed a critical thickness (such as 2 nm or another suitable thickness depending on process conditions) above which conversion to alpha phase can occur during subsequent thermal processing. In order to maximize the volume of the beta phase tungsten material, thin nonmagnetic dusting layer 20 are preferred. However, excessively thin nonmagnetic dusting layer 20 does not effectively function as a dusting layer that preserves the beta phase of the adjoining beta phase tungsten layers 10. Thus, the thickness range from 0.1 nm to 0.3 nm is a good compromise for the thickness of the nonmagnetic dusting layers 20. The alternating stack (10, 20) of the beta phase tungsten layers 10 and the nonmagnetic dusting layers 20 is thus stable against phase change during thermal processing steps that are employed after annealing and patterning the various SOT magnetoresistive memory cells of the present disclosure.

Figure 2:
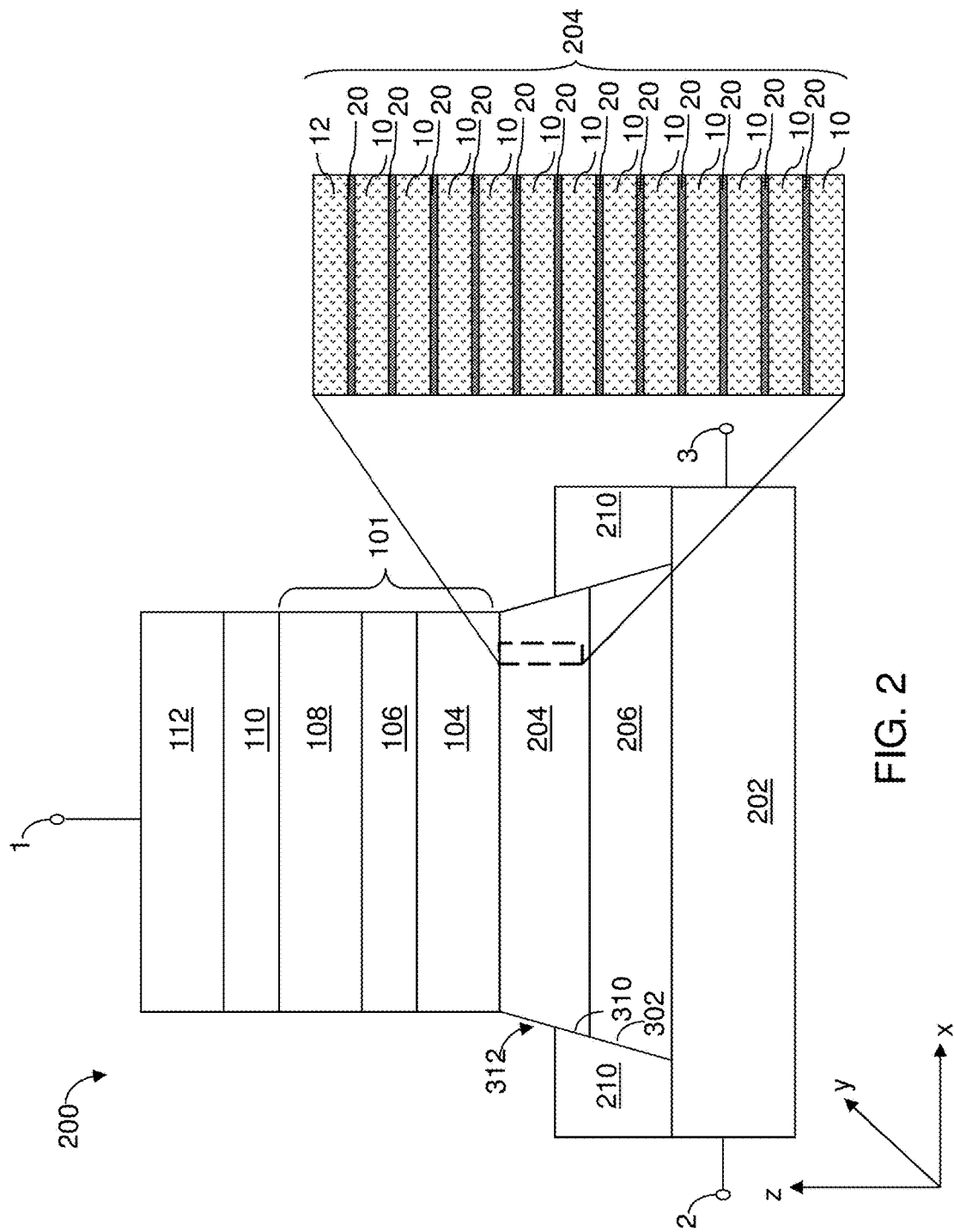
FIG. 2 illustrates a second exemplary structure including an SOT-MRAM device according to an embodiment of the present disclosure.

Referring to FIG. 2, a second exemplary spin orbit torque (SOT) magnetoresistive memory cell 200 according to an embodiment of the present disclosure is illustrated, which is derived from the first exemplary SOT magnetoresistive memory cell 100 illustrated in FIG. 1A by modifying the ferromagnetic bias layer 206, the nonmagnetic spin Hall effect layer 204, and the patterned capping layer 210.

Specifically, the ferromagnetic bias layer 206 is formed with tapered edges 302. The tapered edges 302 may be formed by adjusting the milling angle during patterning of the ferromagnetic bias layer 206. The slope of the tapered edges 302 provides an additional parameter to tune the strength of the stray field from the ferromagnetic bias layer 206 to the free layer 104.

The nonmagnetic spin Hall effect layer 204 can also be formed with tapered edges 310. The tapered edges 310 may be formed by adjusting the milling angle during patterning of the nonmagnetic spin Hall effect layer 204. The slope of the tapered edges 310 provides an additional parameter to amplify the fraction of the write current that flows through the nonmagnetic spin Hall effect layer 204 by direct conduction through the interface of the nonmagnetic spin Hall effect layer 204 and the patterned capping layer 210.

The capping layer 210 can directly contact the portions of the top surface of the AFM layer 202. The tapered edges 302 of the ferromagnetic bias layer 206 aids in allowing the capping layer 210 to be as close as possible to the nonmagnetic spin Hall effect layer 204 while preventing deposition (or re-deposition) on the side walls of the free layer 104.

Figure 3B:
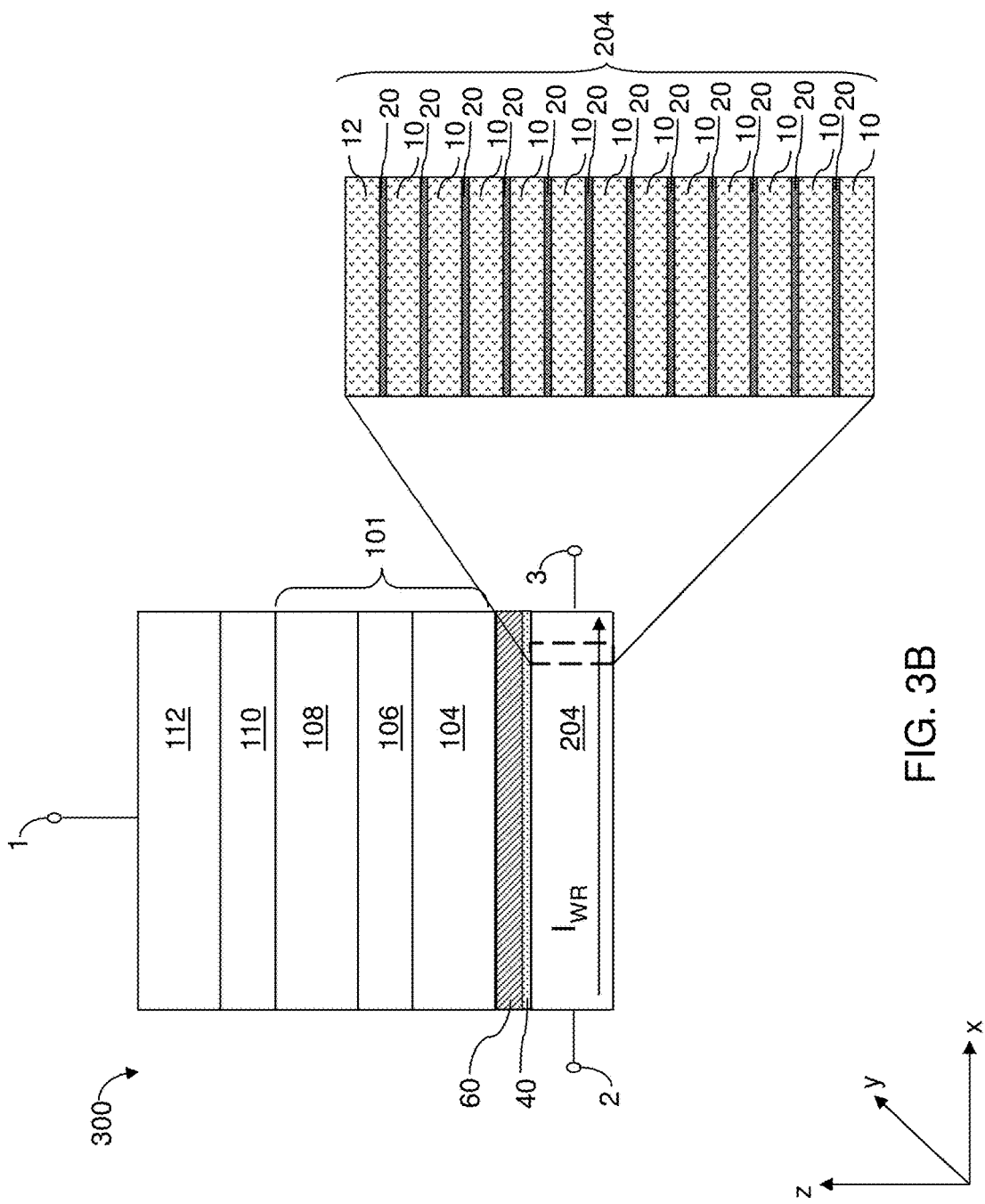
FIG. 3B illustrates an alternative embodiment of the third exemplary structure including an SOT-MRAM device according to an embodiment of the present disclosure.

Referring to FIGS. 3A and 3B, configurations for a third exemplary spin orbit torque (SOT) magnetoresistive memory cell 300 according to an embodiment of the present disclosure are illustrated. The configurations for the third exemplary SOT magnetoresistive memory cell 300 can be derived from the configurations for the first exemplary SOT magnetoresistive memory cell 100 illustrated in FIGS. 1A and 1B by inserting a nonmagnetic spacer layer 40 and a hafnium layer 60 over the nonmagnetic spin Hall effect layer 204.

For example, the nonmagnetic spacer layer 40 can be deposited directly on the top surface of the beta phase tungsten cap layer 12 (or on top of the alternating stack (10, 20) if the cap layer 12 is omitted). The nonmagnetic spacer layer 40 is preferably a noble metal, and can consist essentially of ruthenium or platinum, and can have a thickness in a range from 0.1 nm to 0.4 nm. The hafnium layer 60 can be deposited directly on the top surface of the nonmagnetic spacer layer 40. The hafnium layer 60 can consist essentially of hafnium, and can have a thickness in a range from 0.4 nm to 1.5 nm, such as from 0.5 nm to 1 nm.

Insertion of the hafnium layer 60 between a beta phase tungsten layer (e.g., the beta phase tungsten cap layer 12 or the alternating stack (10, 20)) and the free layer 104 increases the effective (interfacial) perpendicular anisotropy field of the free layer 104, thereby reducing the effective magnetization $B_S^{eff}$ of the free layer 104, and as a corollary, reducing the critical switching current. Direct contact between a beta phase tungsten layer and a hafnium layer can induce conversion of the beta phase tungsten material into another (e.g., alpha) phase of the tungsten material. The nonmagnetic spacer layer 40 functions as a spacer layer that prevents conversion of the beta phase tungsten cap layer 12 to alpha phase. In one embodiment, the free layer 104 of the magnetic tunnel junction 101 can be formed directly on the hafnium layer 60.

In an alternative embodiment, the alternating stack of beta phase tungsten layers 10 and the dusting layers 20 of the memory cell 300 may be replaced by a single thicker beta phase tungsten layer. In this embodiment, the spin Hall effect layer 204 may consist of a single beta phase tungsten layer, and the nonmagnetic spacer layer 40 and the hafnium layer 60 are formed over the beta phase tungsten nonmagnetic spin Hall effect layer 204. Thus, only one of the alternating stack (10, 20) or the hafnium layer 60 may be included in the memory cell 300, or both of them can be included in the memory cell 300 in combination.

Figure 4:
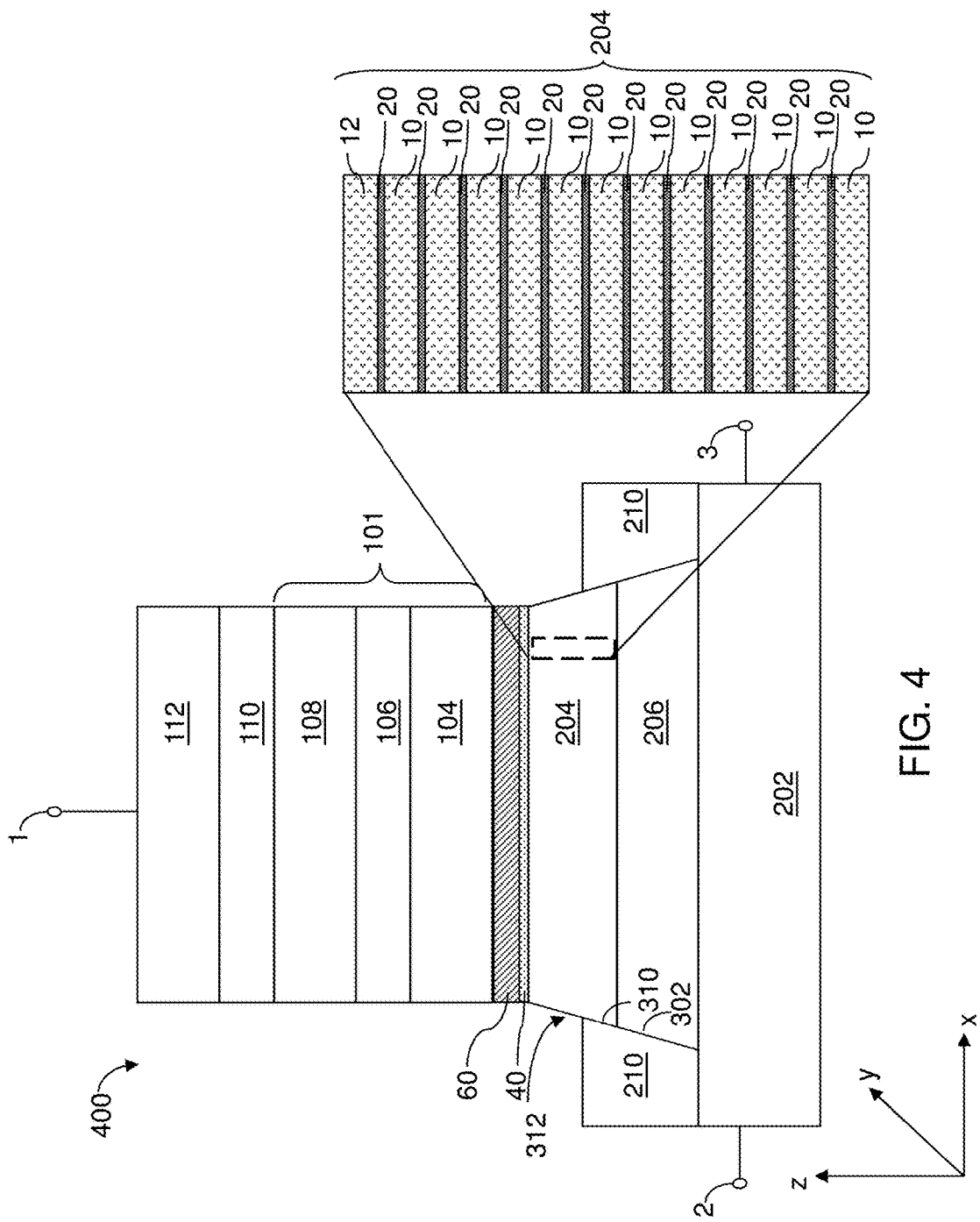
FIG. 4 illustrates a fourth exemplary structure including an SOT-MRAM device according to an embodiment of the present disclosure.

Referring to FIG. 4, a fourth exemplary spin orbit torque (SOT) magnetoresistive memory cell 400 according to an embodiment of the present disclosure is illustrated, which is derived from the second exemplary SOT magnetoresistive memory cell 200 illustrated in FIG. 2A by inserting a nonmagnetic spacer layer 40 and a hafnium layer 60 over the nonmagnetic spin Hall effect layer 204. The nonmagnetic spacer layer 40 and the hafnium layer 60 can be the same as in the third exemplary SOT magnetoresistive memory cell 300 illustrated in FIGS. 3A and 3B, and provide the same benefits as in the third exemplary SOT magnetoresistive memory cell 300.

Figure 5A:
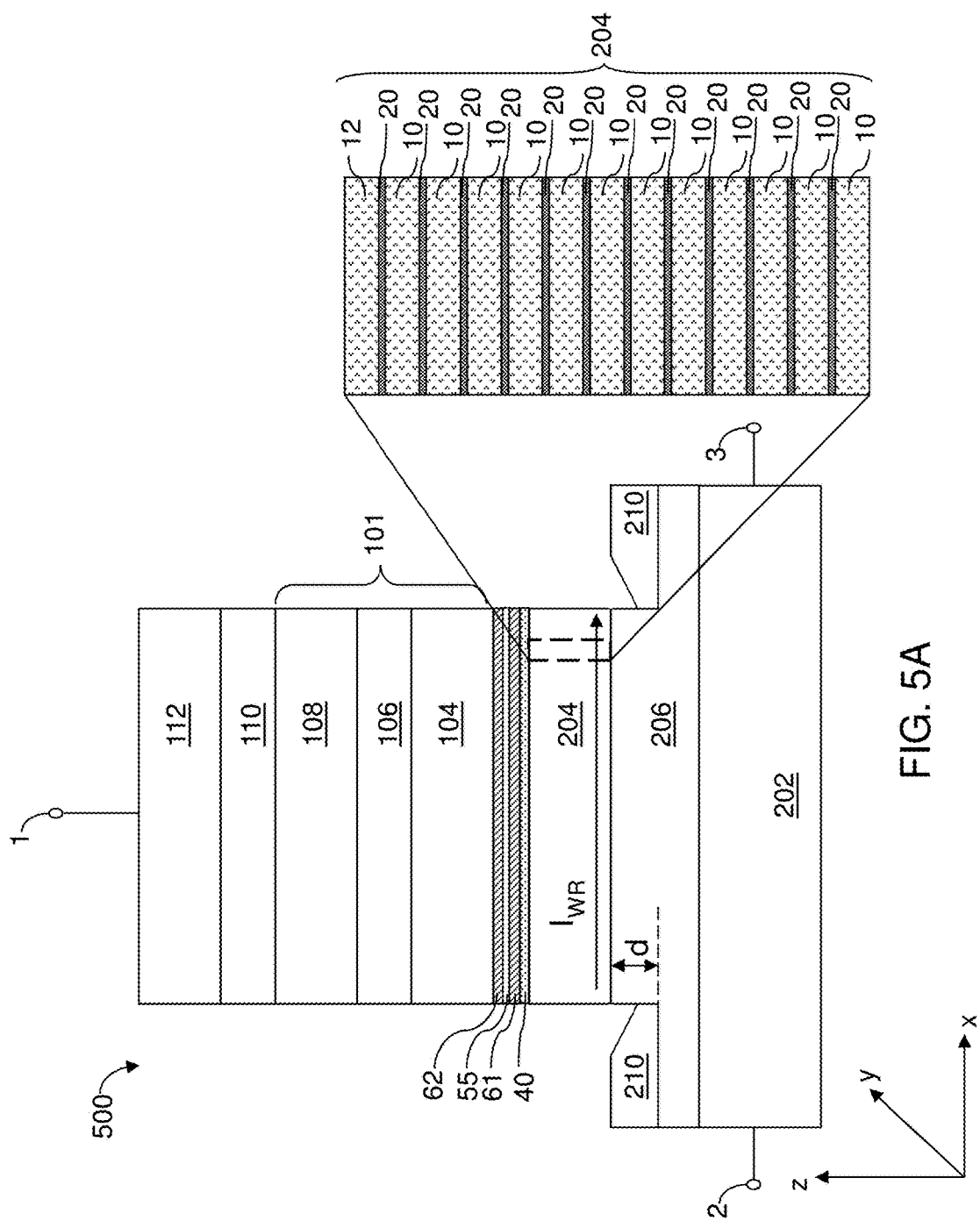
FIG. 5A illustrates a fifth exemplary structure including an SOT-MRAM device according to an embodiment of the present disclosure.
Figure 5B:
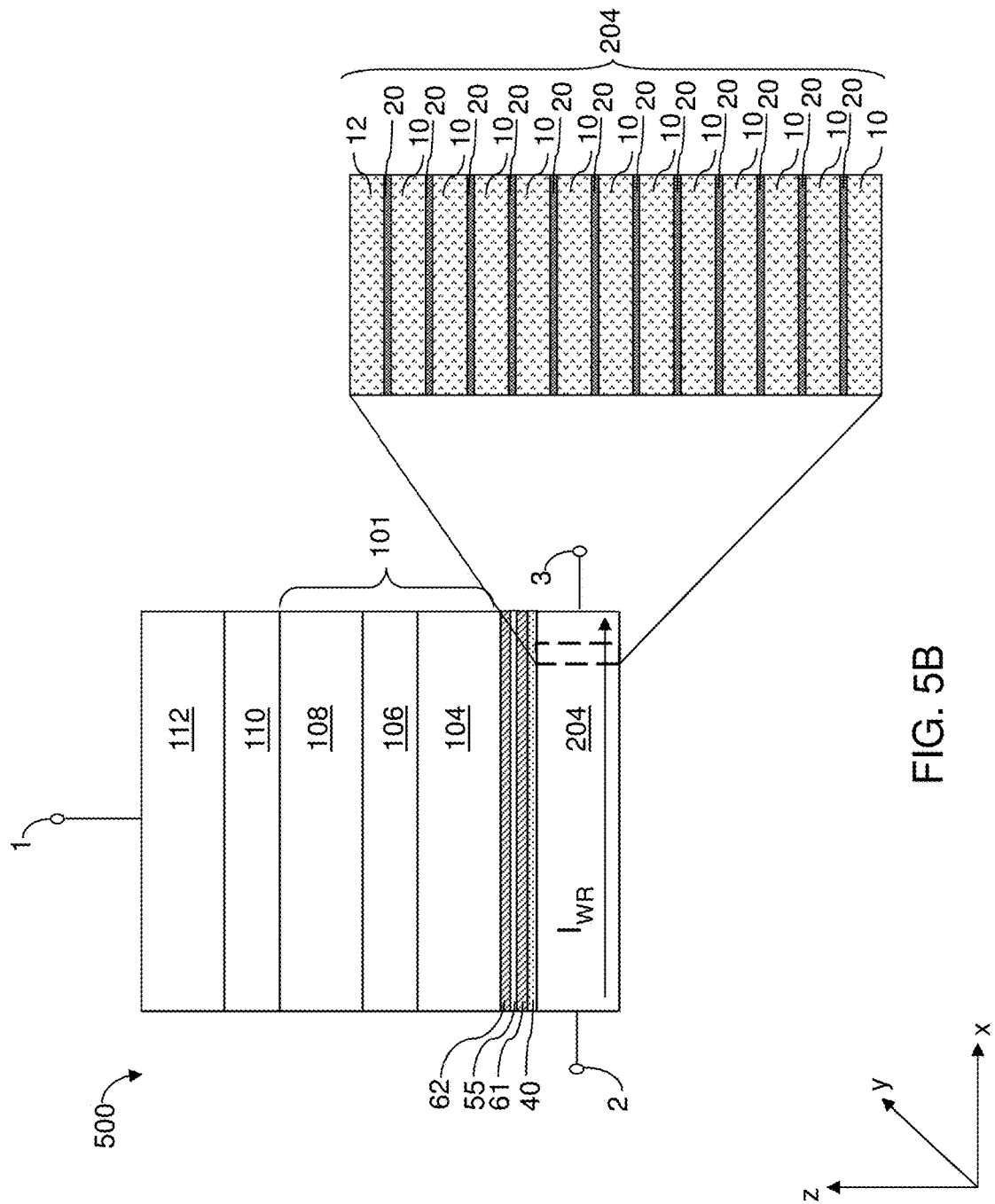
FIG. 5B illustrates an alternative embodiment of the fifth exemplary structure including an SOT-MRAM device according to an embodiment of the present disclosure.

Referring to FIGS. 5A and 5B, configurations for a fifth exemplary spin orbit torque (SOT) magnetoresistive memory cell 500 according to an embodiment of the present disclosure are illustrated. The configurations for the fifth exemplary SOT magnetoresistive memory cell 500 are derived from the configurations for the third exemplary SOT magnetoresistive memory cell 300 illustrated in FIGS. 3A and 3B by replacing the hafnium layer 60 with a layer stack including a first hafnium layer 61, a hafnium oxide layer 55, and a second hafnium layer 62. Alternatively, the modification of the third exemplary spin orbit torque (SOT) magnetoresistive memory cell 300 into the fifth exemplary spin orbit torque (SOT) magnetoresistive memory cell 500 may be viewed as insertion of additional hafnium oxide layer 55 and second hafnium layer 62 between the hafnium layer 60 (which corresponds to the first hafnium layer 61) and the free layer 104.

The hafnium oxide layer 55 may be formed by oxidation of a surface portion of the first hafnium layer 61. The hafnium oxide layer 55 in proximity to the free layer 104 can induce reduction of the damping constant α in the free layer 104, thereby reducing the critical switching current for inducing a transition in the magnetization of the free layer 104. However, oxidation of the free layer 104 is undesirable. The second hafnium oxide layer 62 can be interposed between the hafnium oxide layer 55 and the free layer 104 to prevent oxidation of the free layer 104. The free layer 104 of the magnetic tunnel junction 101 can be formed over, and directly on, the second hafnium layer 62. In one embodiment, the first hafnium layer 61 can have a thickness in a range from 0.3 nm to 1 nm, such as 0.5 nm to 0.8 nm; the hafnium oxide layer 55 can have a thickness in a range from 0.1 nm to 0.5 nm; and the second hafnium layer 62 can have a thickness in a range from 0.3 nm to 1 nm, such as 0.5 to 0.8 nm.

In an alternative embodiment, the alternating stack of beta phase tungsten layers 10 and the dusting layers 20 of the memory cell 500 may be replaced by a single thicker beta phase tungsten layer. In this embodiment, the spin Hall effect layer 204 may consist of a single beta phase tungsten layer, and the nonmagnetic spacer layer 40, the first hafnium layer 61, the hafnium oxide layer 55, and the second hafnium layer 62 are formed over the beta phase tungsten nonmagnetic spin Hall effect layer 204. Thus, only one of the alternating stack (10, 20) or the stack of layers (61, 55, 62) may be included in the memory cell 500, or both of them can be included in the memory cell 500 in combination.

Figure 6:
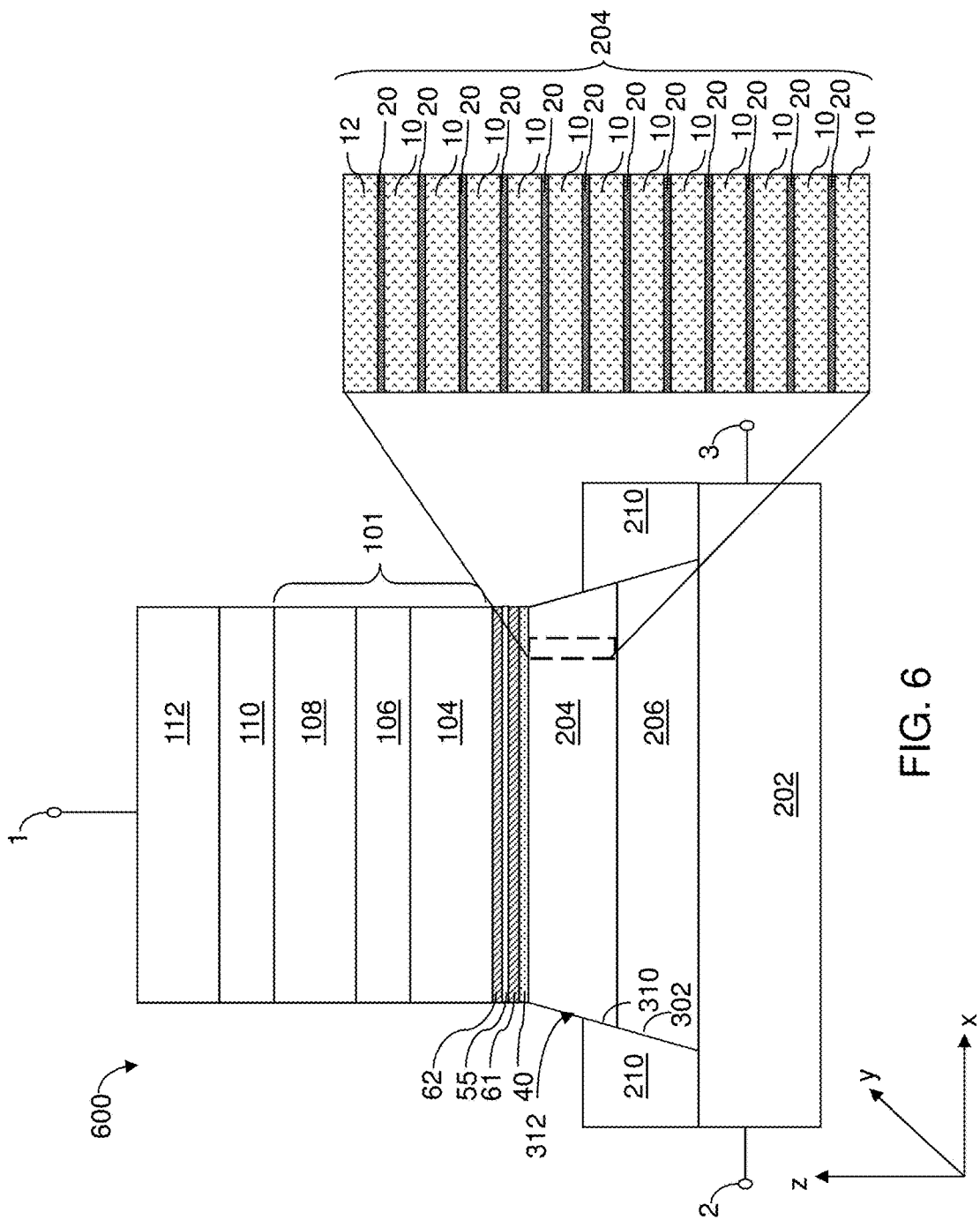
FIG. 6 illustrates a sixth exemplary structure including an SOT-MRAM device according to an embodiment of the present disclosure.

Referring to FIG. 6, a sixth exemplary spin orbit torque (SOT) magnetoresistive memory cell 600 according to an embodiment of the present disclosure is illustrated, which is derived from the fourth exemplary SOT magnetoresistive memory cell 400 illustrated in FIG. 4 by replacing the hafnium layer 60 with a layer stack including a first hafnium layer 61, a hafnium oxide layer 55, and a second hafnium layer 62. The first hafnium layer 61, the hafnium oxide layer 55, and the second hafnium layer 62 can be the same as in the fifth exemplary SOT magnetoresistive memory cell 500 illustrated in FIG. 5, and provide the same benefits as in the fifth exemplary SOT magnetoresistive memory cell 500.

Figure 7A:
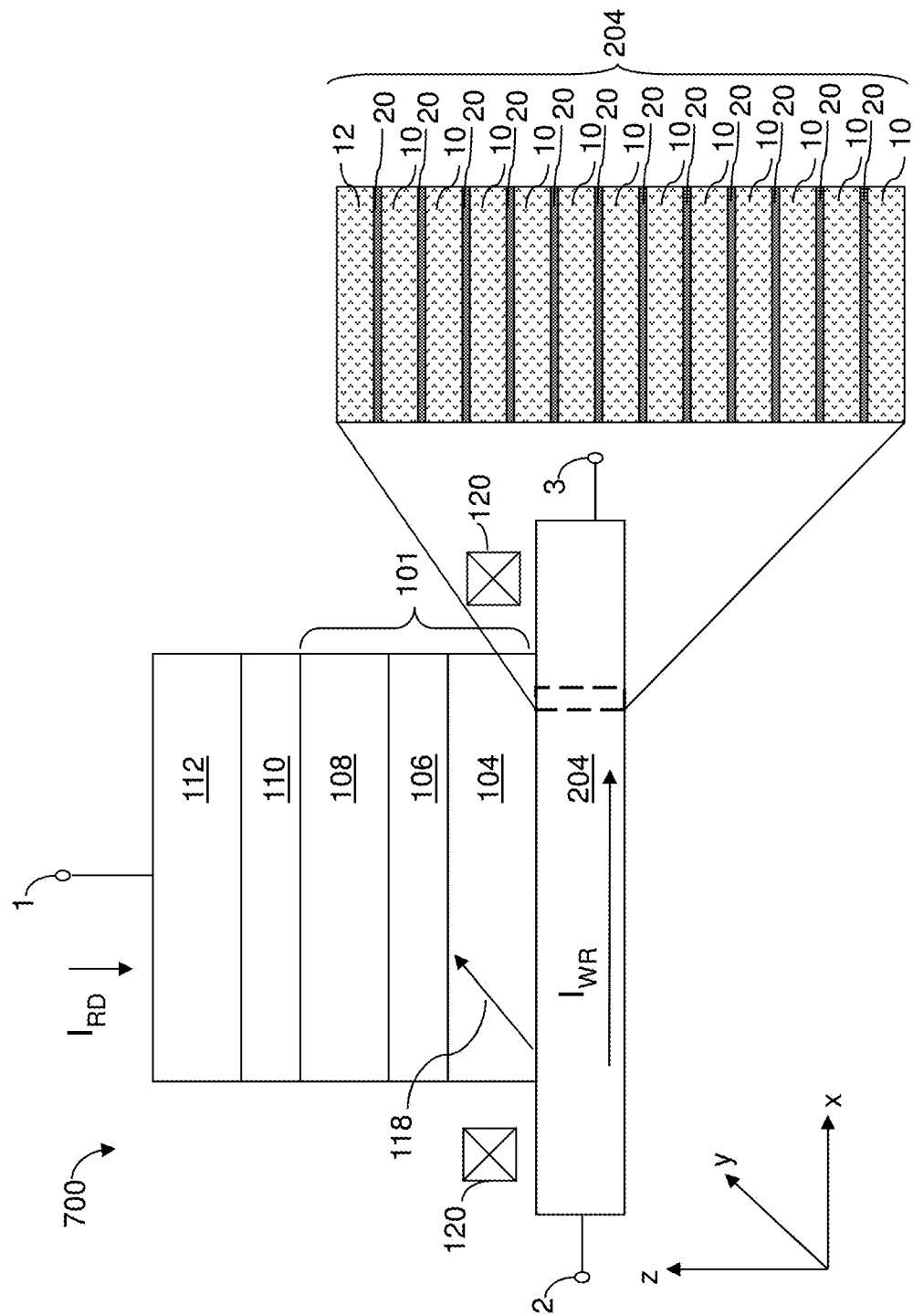
FIGS. 7A, 7B and 7C illustrate seventh, eighth and ninth exemplary structures including SOT-MRAM devices, respectively, according to embodiments of the present disclosure.

Referring to FIG. 7A, a seventh exemplary spin orbit torque (SOT) magnetoresistive memory cell 700 according to an embodiment of the present disclosure is illustrated, which is derived from the first exemplary SOT magnetoresistive memory cell 100 illustrated in FIG. 1A by replacing the combination of layers 202, 204 and 206 with any of the spin Hall effect layers (i.e., SOT layers) 204 described in the above embodiments. Thus, the AFM layer 202 and the ferromagnetic bias layer 206 can be omitted in this embodiment. The second terminal 2 and the third terminal 3 can be electrically connected directly to the spin Hall effect layer 204 rather than to the AFM layer 202 of the prior embodiments. Permanent magnets 120 can be positioned about the memory cell 700 to provide an additional magnetic bias field, $H_B$. The combination of the magnetic bias field oriented in plane with the write current $I_{WT}$, and parallel to the write current, results in a spin orbit torque 118 in the y-direction. The spin orbit torque 118 exerts a torque on the initial magnetization of the free layer 104 so that the magnetization may change, for example, from a parallel state to an antiparallel state. The free layer 104 and the reference layer 108 have perpendicular magnetic anisotropy, and thus, vertical easy axis of magnetization.

Figure 8A:
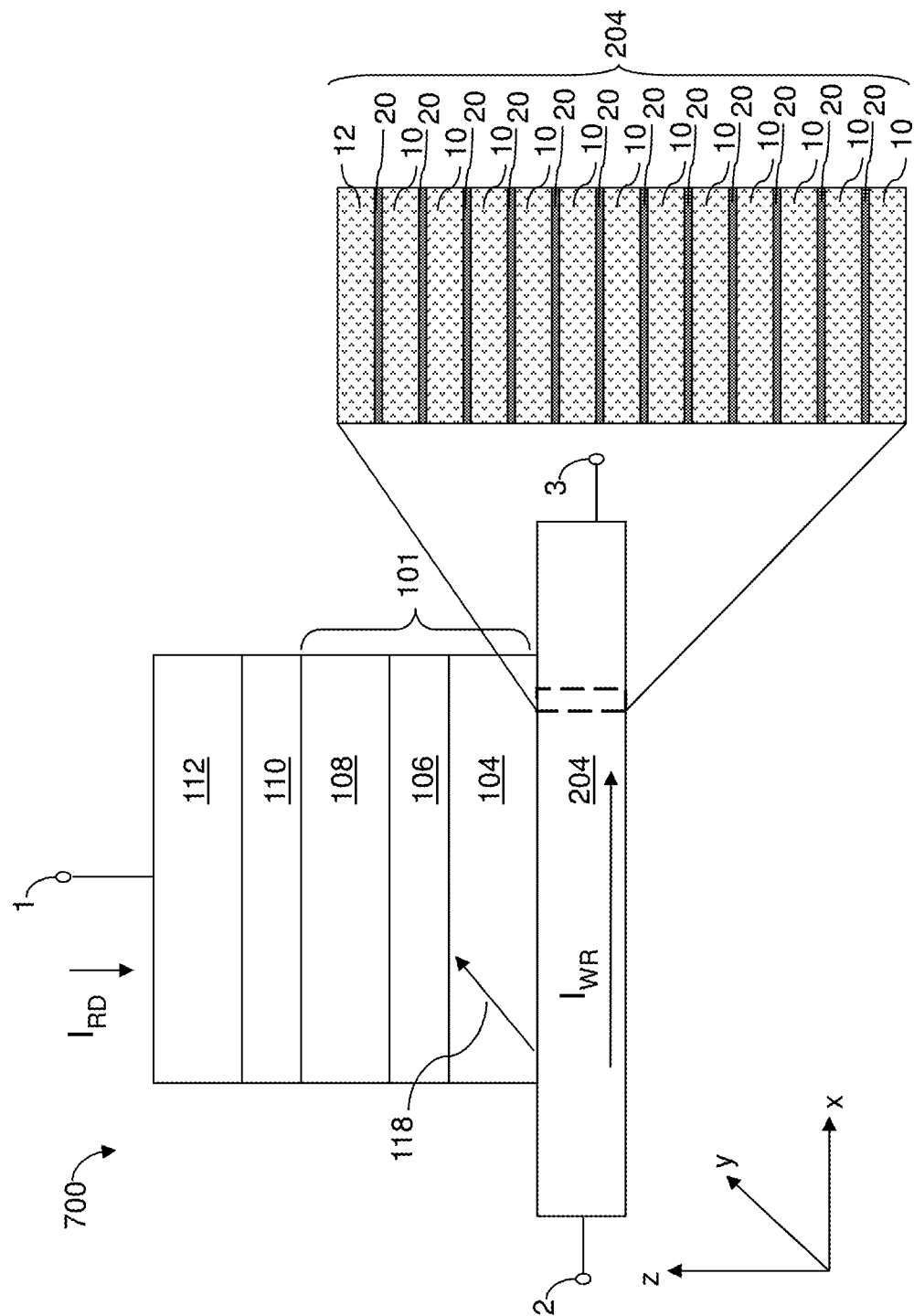
FIGS. 8A, 8B and 8C illustrate alternative embodiments of the seventh, eighth and ninth exemplary structures including SOT-MRAM devices, respectively, according to embodiments of the present disclosure.

Referring to FIG. 8A, an alternative embodiment of the seventh SOT magnetoresistive memory cell 700 is shown, which is derived from the seventh exemplary SOT magnetoresistive memory cell 700 illustrated in FIG. 7A where the free layer 104 and the reference layer 108 have in-plane magnetic anisotropy, and thus, in-plane easy axis of magnetization. Compared to the structure of FIG. 7A, the permanent magnets 120 are not necessary.

Figure 7B:
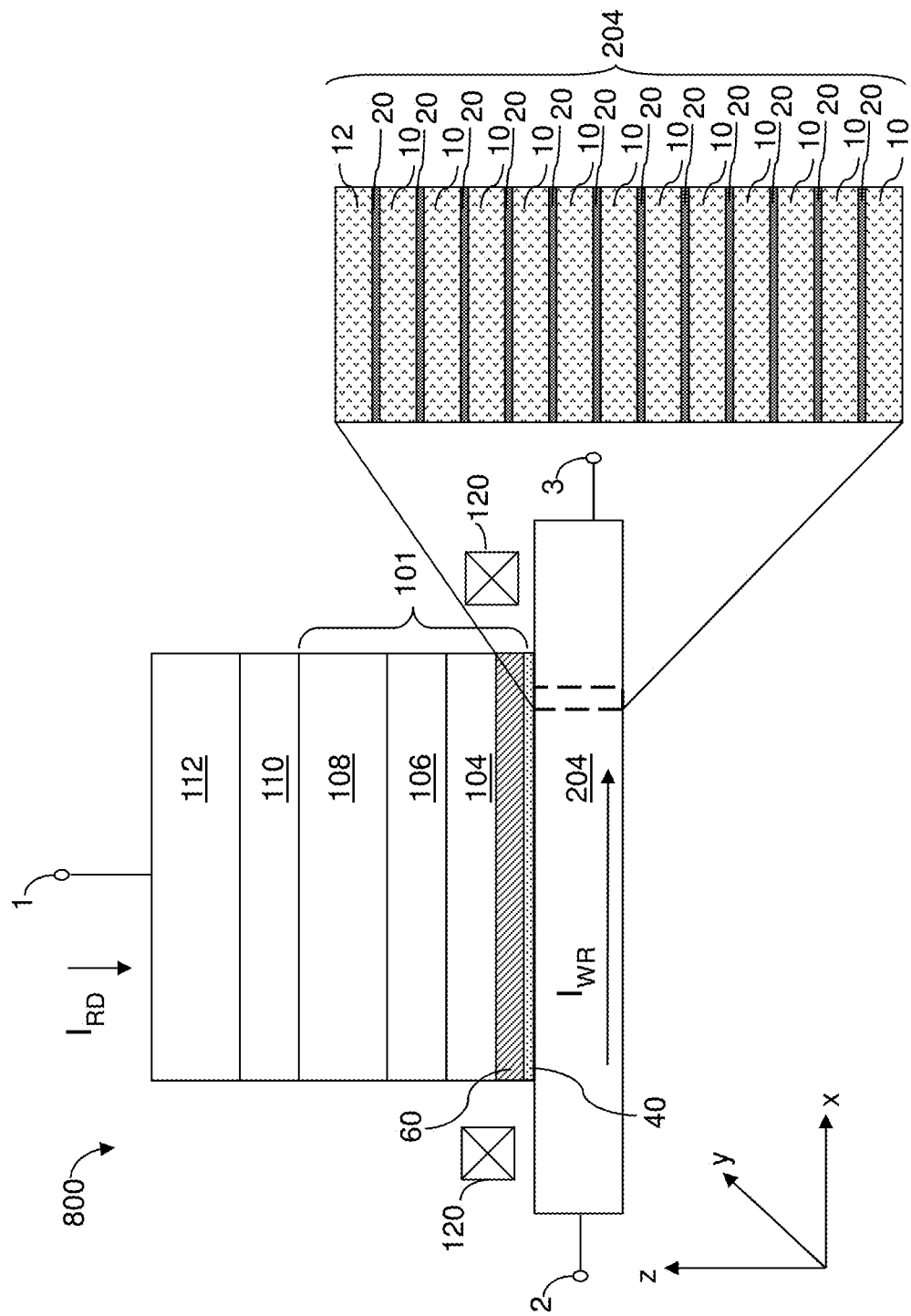

Referring to FIG. 7B, an eighth exemplary spin orbit torque (SOT) magnetoresistive memory cell 800 according to an embodiment of the present disclosure is illustrated, which is derived from the seventh exemplary SOT magnetoresistive memory cell 700 illustrated in FIG. 7A by inserting a nonmagnetic spacer layer 40 and the hafnium layer 60 over the nonmagnetic spin Hall effect layer 204. The nonmagnetic spacer layer 40 and the hafnium layer 60 can be the same as in the third exemplary SOT magnetoresistive memory cell 300 illustrated in FIG. 3A, and provide the same benefits as in the third exemplary SOT magnetoresistive memory cell 300.

In an alternative embodiment, the alternating stack of beta phase tungsten layers 10 and the dusting layers 20 of the memory cell 800 may be replaced by a single thicker beta phase tungsten layer. In this embodiment, the spin Hall effect layer 204 may consist of a single beta phase tungsten layer, and the nonmagnetic spacer layer 40 and a hafnium layer 60 are formed over the beta phase tungsten nonmagnetic spin Hall effect layer 204. Thus, only one of the alternating stack (10, 20) or the hafnium layer 60 may be included in the memory cell 800, or both of them can be included in the memory cell 800 in combination. The free layer 104 and the reference layer 108 have perpendicular magnetic anisotropy, and thus, vertical easy axis of magnetization.

Figure 8B:
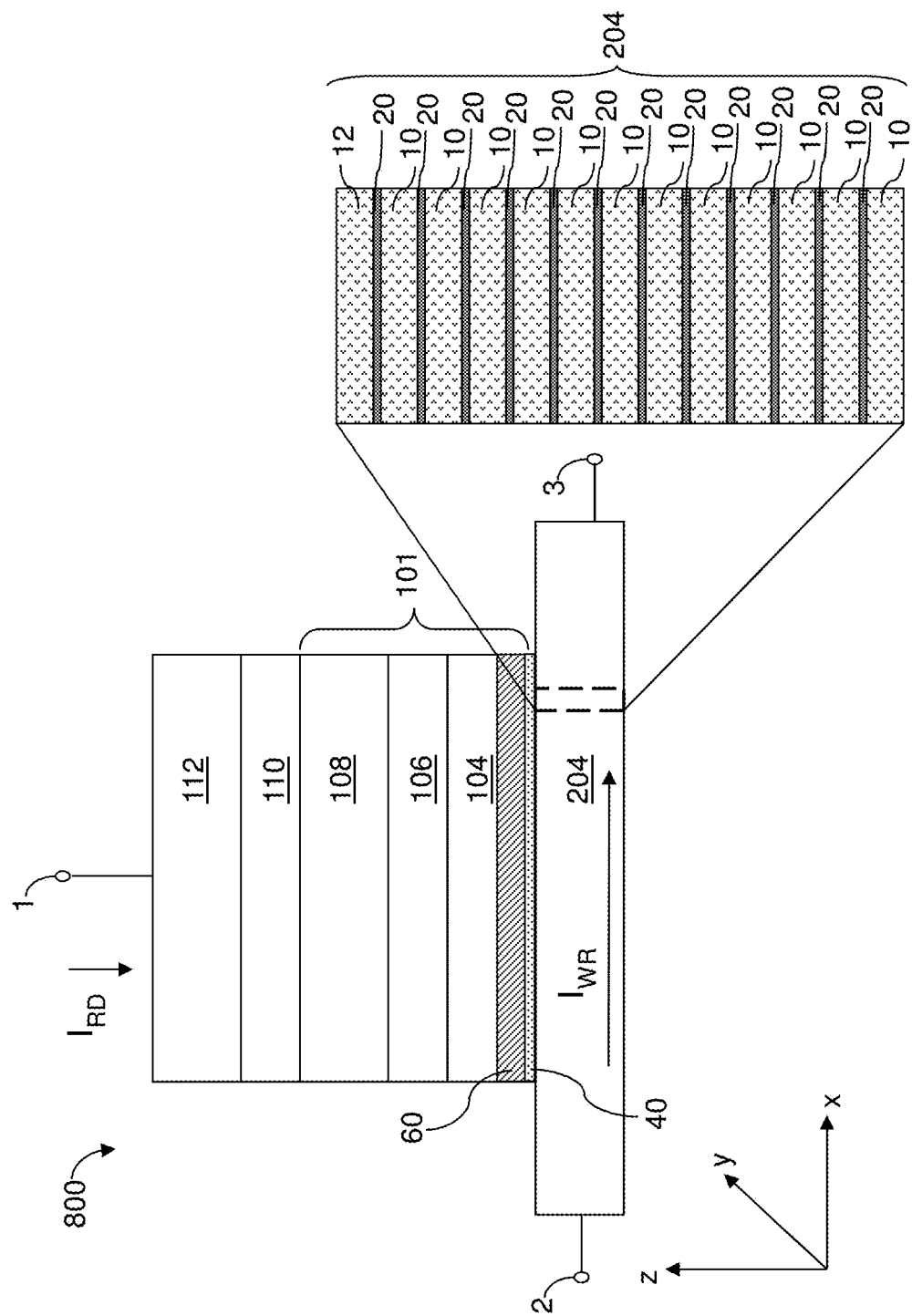

Referring to FIG. 8B, an alternative embodiment of the eighth SOT magnetoresistive memory cell 800 is shown, which is derived from the eighth exemplary SOT magnetoresistive memory cell 800 illustrated in FIG. 7B where the free layer 104 and the reference layer 108 have in-plane magnetic anisotropy, and thus, in-plane easy axis of magnetization. Compared to the structure of FIG. 7B, the permanent magnets 120 are not necessary.

Figure 7C:
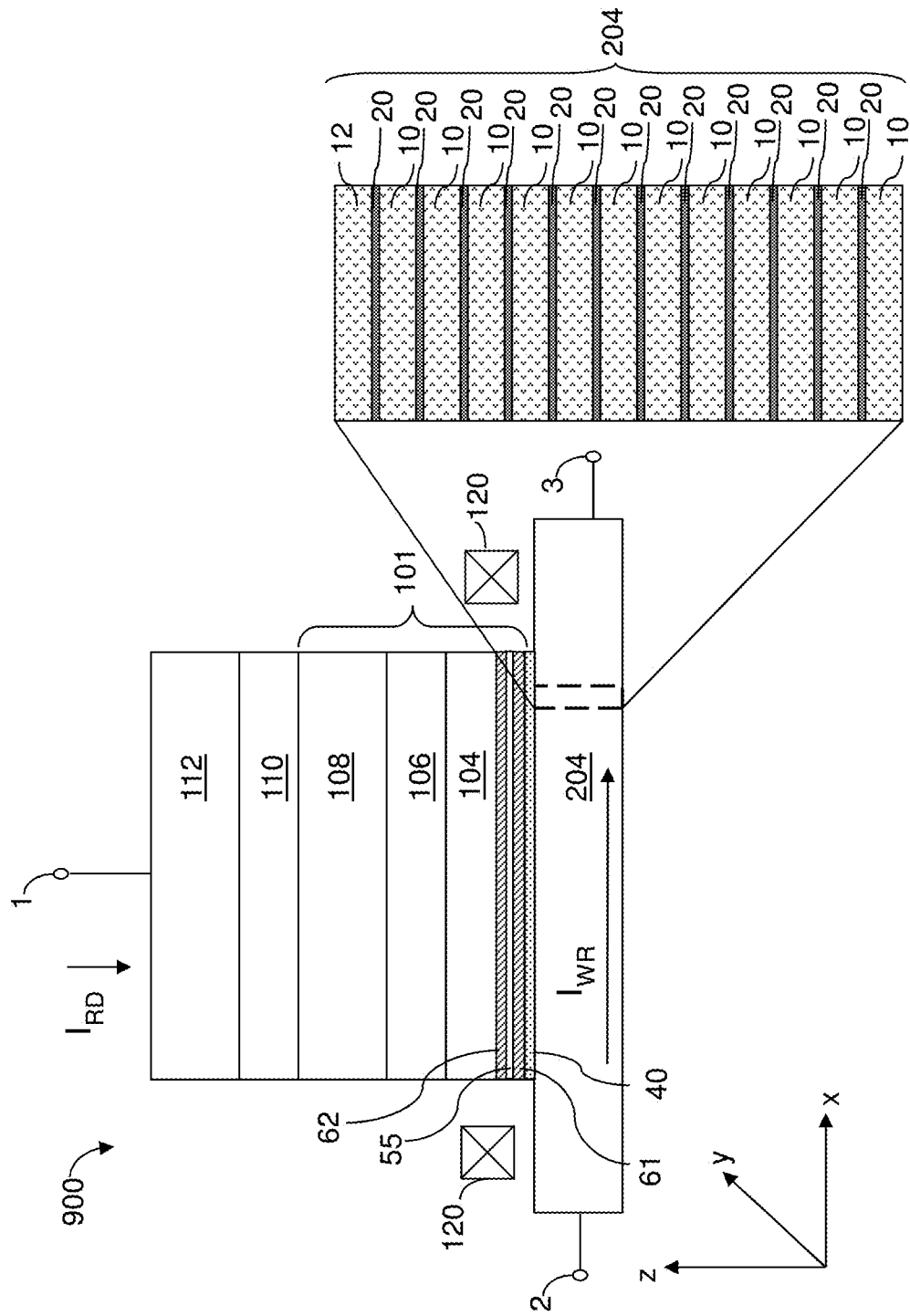

Referring to FIG. 7C, a ninth exemplary spin orbit torque (SOT) magnetoresistive memory cell 900 according to an embodiment of the present disclosure is illustrated, which is derived from the eighth exemplary SOT magnetoresistive memory cell 800 illustrated in FIG. 7B by replacing the hafnium layer 60 with a layer stack including a first hafnium layer 61, a hafnium oxide layer 55, and a second hafnium layer 62. The first hafnium layer 61, the hafnium oxide layer 55, and the second hafnium layer 62 can be the same as in the fifth exemplary SOT magnetoresistive memory cell 500 illustrated in FIG. 5A, and provide the same benefits as in the fifth exemplary SOT magnetoresistive memory cell 500.

In an alternative embodiment, the alternating stack of beta phase tungsten layers 10 and the dusting layers 20 of the memory cell 900 may be replaced by a single thicker beta phase tungsten layer. In this embodiment, the spin Hall effect layer 204 may consist of a single beta phase tungsten layer, and the nonmagnetic spacer layer 40, the first hafnium layer 61, the hafnium oxide layer 55, and the second hafnium layer 62 are formed over the beta phase tungsten nonmagnetic spin Hall effect layer 204. Thus, only one of the alternating stack (10, 20) or the stack of layers (61, 55, 62) may be included in the memory cell 900, or both of them can be included in the memory cell 900 in combination. The free layer 104 and the reference layer 108 have perpendicular magnetic anisotropy, and thus, vertical easy axis of magnetization.

Figure 8C:
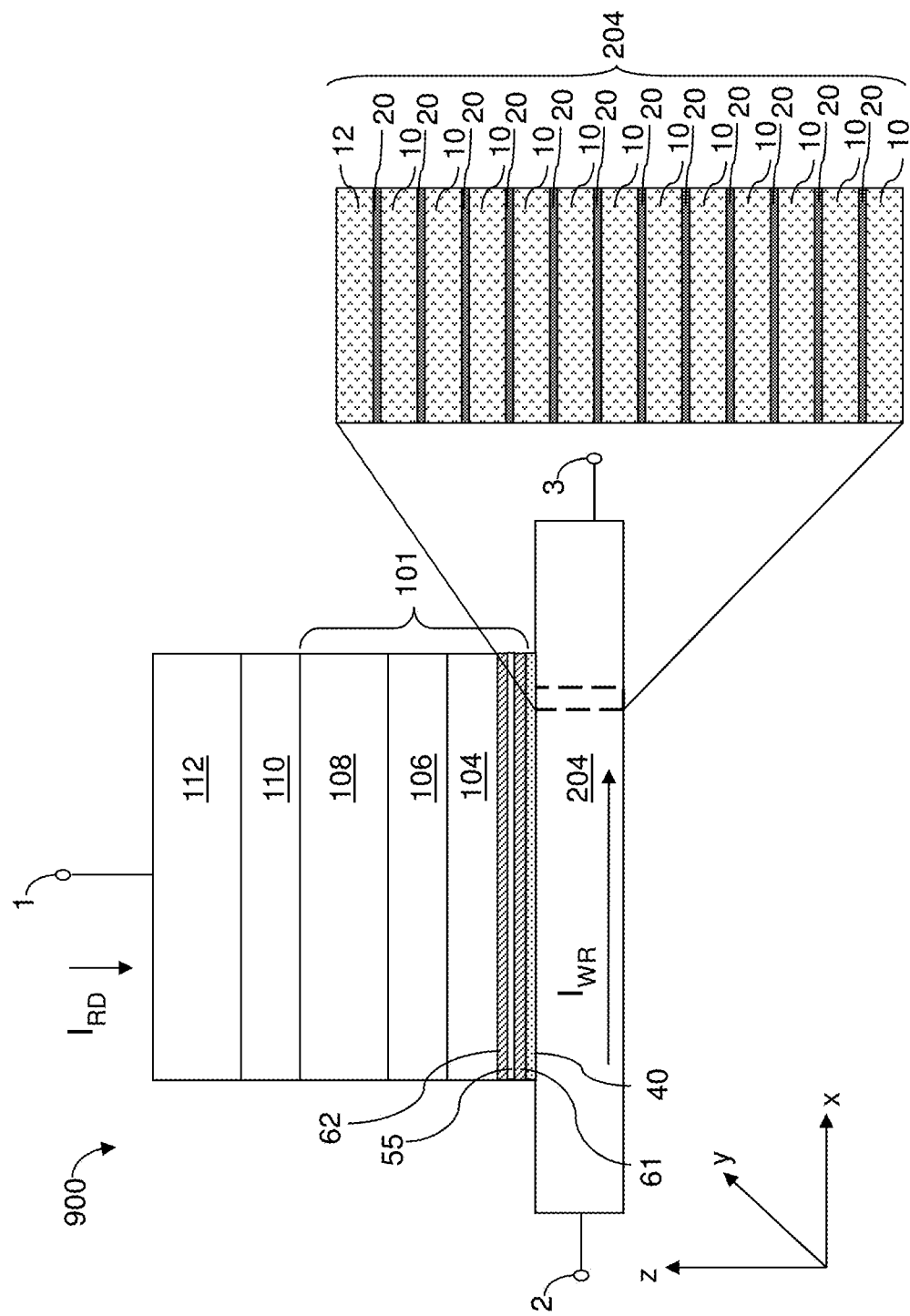

Referring to FIG. 8C, an alternative embodiment of the ninth SOT magnetoresistive memory cell 900 is shown, which is derived from the ninth exemplary SOT magnetoresistive memory cell 900 illustrated in FIG. 7C in which the free layer 104 and the reference layer 108 have in-plane magnetic anisotropy, and thus, in-plane easy axis of magnetization. Compared to the structure of FIG. 7C, the permanent magnets 120 are not necessary.

Figure 9A:
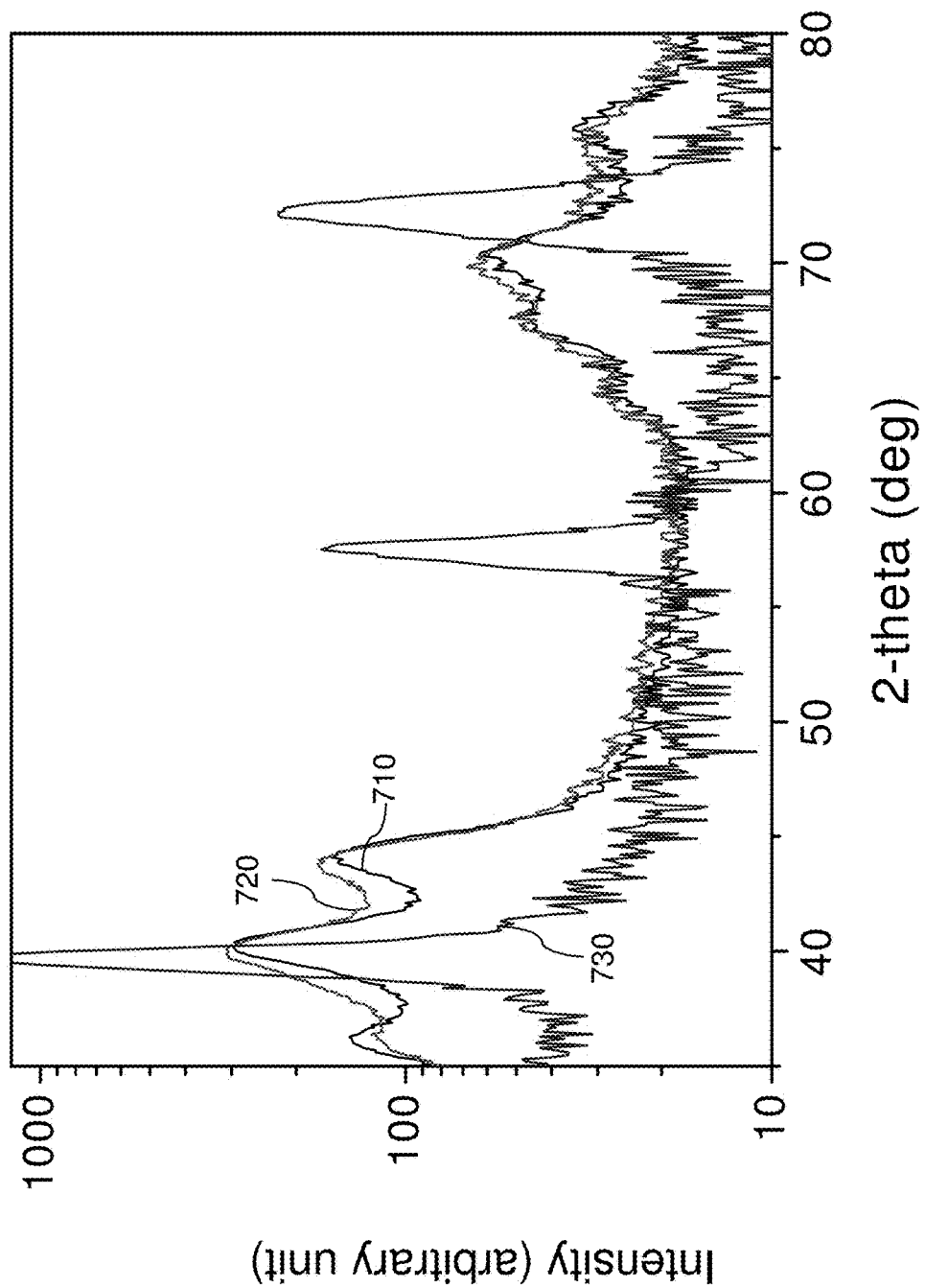
FIG. 9A illustrates X-ray diffraction data from 2θ scans of three alternating stacks of tungsten layers and intervening layers according to an embodiment of the present disclosure.

FIG. 9A illustrates X-ray diffraction data from 2θ scans of three alternating stacks of tungsten layers 10 and intervening layers (i.e., nonmagnetic dusting layers) 20 covered by the cap layer 12. Curve 710 represents the intensity of the scattered X-ray beam as a function of 2θ for a first sample including 10 repetitions of a 1 nm thick beta phase tungsten layer 10 and a 0.2 nm thick ruthenium dusting layer 20, capped with a 1 nm thick beta phase tungsten layer 12 according to an embodiment of the present disclosure. Curve 720 represents the intensity of the scattered X-ray beam as a function of 2θ for a second sample including 10 repetitions of a 1 nm thick beta phase tungsten layer 10 and a 0.2 nm thick platinum dusting layer 20, capped with a 1 nm thick beta phase tungsten layer 12 according to an embodiment of the present disclosure. Curve 730 represents the intensity of the scattered X-ray beam as a function of 2θ for a third sample including 10 repetitions of a 1 nm thick beta phase tungsten layer and a 0.2 nm thick hafnium dusting layer, capped with a 1 nm thick beta phase tungsten layer, which was is employed as a reference sample. Beta phase peaks are clearly visible in curve 710 and curve 720. In contrast, beta phase peaks are not visible in curve 730. Only alpha phase tungsten peaks are visible in curve 730. The comparison of the three 2θ scans in FIG. 9A illustrate the effectiveness of the of the alternating stack (10, 20) of beta phase tungsten layers 10 and noble metal nonmagnetic dusting layers 20 such as ruthenium or platinum, and also illustrates ineffectiveness of a base metal, such as hafnium as a dusting layer material in preserving the beta phase of the beta phase tungsten layers that are as thin as 1 nm.

Figure 9B:
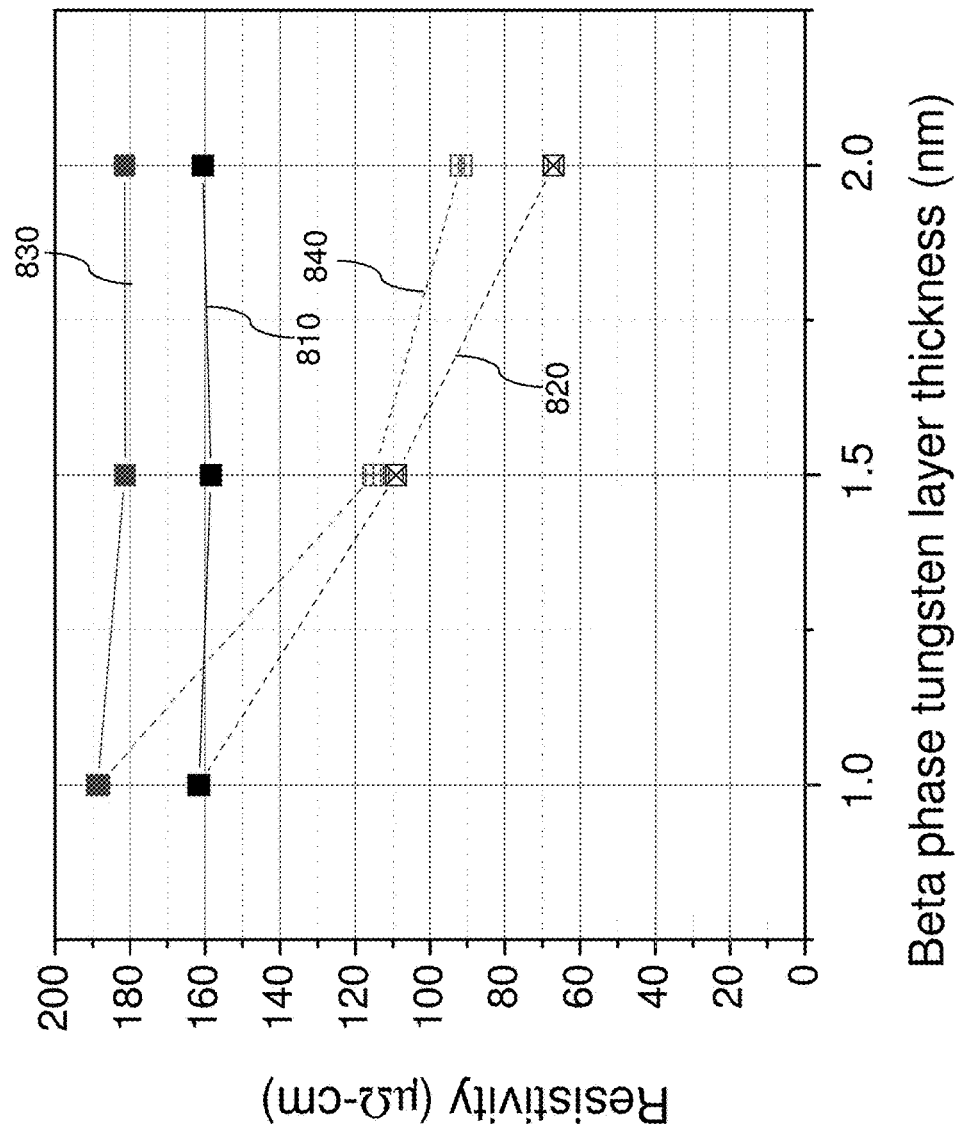
FIG. 9B is a plot of resistivity versus beta phase tungsten layer thickness which illustrates resistivity measurement data before and after anneal for alternating stacks of tungsten layers and dusting layers according to embodiments of the present disclosure.

FIG. 9B illustrates resistivity measurement data before and after anneal for alternating stacks (10, 20) of beta phase tungsten layers 10 and nonmagnetic dusting layers 20 including ruthenium or platinum according to an embodiment of the present disclosure. Beta phase tungsten has a higher resistivity than alpha phase tungsten. Curve 810 corresponds to a set of resistivity measurements after film deposition on first samples including ten repetitions of beta phase tungsten layers 10 of the thickness represented by the x-axis (which are 1 nm, 1.5 nm, and 2 nm, respectively) and 0.2 nm thick ruthenium dusting layers 20, capped with a 1 nm thick beta phase tungsten cap layer. Curve 820 corresponds to a set of resistivity measurements on the first samples after a 5 hour anneal at 280 degrees Celsius. Curve 830 corresponds to a set of resistivity measurements after film deposition on second samples including ten repetitions of beta phase tungsten layers 10 of the thickness represented by the x-axis (which are 1 nm, 1.5 nm, and 2 nm, respectively) and 0.2 nm thick platinum dusting layers 20, capped with a 1 nm thick beta phase tungsten cap layer. Curve 840 corresponds to a set of resistivity measurements on the second samples after a 5 hour anneal at 280 degrees Celsius.

Resistivity reduction after the anneal is observed on samples in which the beta tungsten layer thickness is 1.5 nm or 2 nm, while resistivity does not change in samples in which the beta tungsten layer thickness is 1 nm. Such resistivity change in the samples in which the beta tungsten layer thickness is 1.5 nm or 2 nm are believed to reflect phase changes in the tungsten material from the beta phase into the alpha phase induced by the anneal. Thus, limiting the thickness of the beta phase tungsten layer 10 has the beneficial effect of preventing phase change of the beta phase tungsten material into alpha phase tungsten material under anneal conditions. It is believed that the thickness of the beta phase tungsten layers 10 that does not exceed 1.2 nm, such as 0.8 to 1 nm, provides suitable temperature stability for practical magnetoresistive memory device fabrication.

Figure 10:
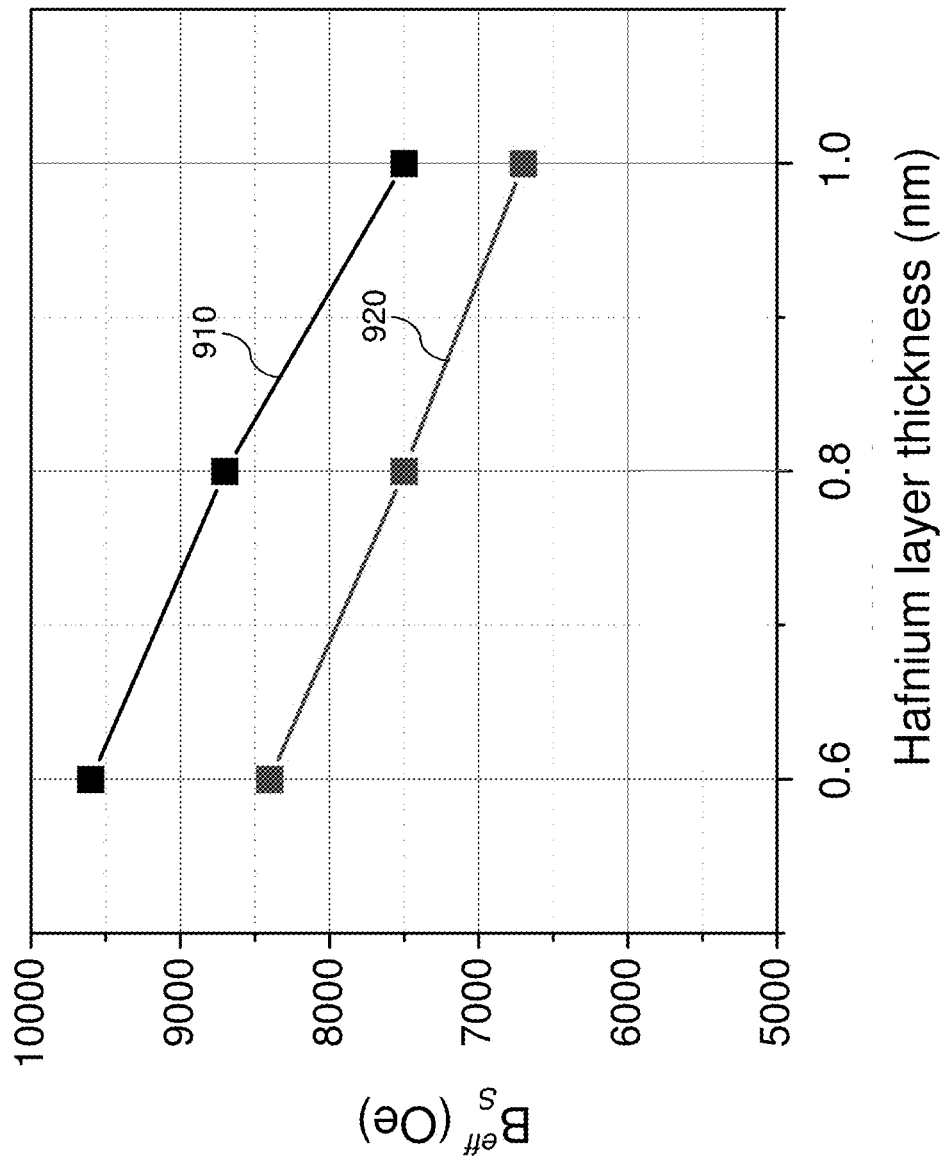
FIG. 10 is a plot which illustrates effective magnetization of a free layer as a function of a thickness of an intervening hafnium layer according to an embodiment of the present disclosure.

FIG. 10 illustrates the effective magnetization $B_S^{eff}$ of a free layer 104 as a function of the thickness of an intervening hafnium layer 60 according to an embodiment of the present disclosure. Curve 910 shows the effective out-of-plane magnetic stiffness $B_S^{eff}$ of the free layer 104 for a sample including an alternating stack (10, 20) including eight repetitions of a pair of a 1 nm thick beta phase tungsten layer 10 and a 2 nm thick ruthenium dusting layer 20, capped with a 1 nm thick beta phase tungsten cap layer 12, followed by a 0.2 nm thick ruthenium layer 40 and a hafnium layer 60 having the thickness corresponding to the x-coordinates (i.e., 0.6 nm, 0.8 nm, and 1 nm, respectively). Curve 920 shows the effective magnetization $B_S^{eff}$ of the free layer 104 for a sample including an alternating stack (10, 20) including eight repetitions of a pair of a 1 nm thick beta phase tungsten layer 10 and a 2 nm thick platinum dusting layer 20, capped with a 1 nm thick beta phase tungsten cap layer 12, followed by a 0.2 nm thick platinum layer 40 and a hafnium layer 60 having the thickness corresponding to the x-coordinates (i.e., 0.6 nm, 0.8 nm, and 1 nm, respectively). The value of $B_S^{eff}$ of a free layer 104 decreases with the thickness of the hafnium layer 60, illustrating the effectiveness of the hafnium layer in decreasing the critical switching current.

Figure 11:
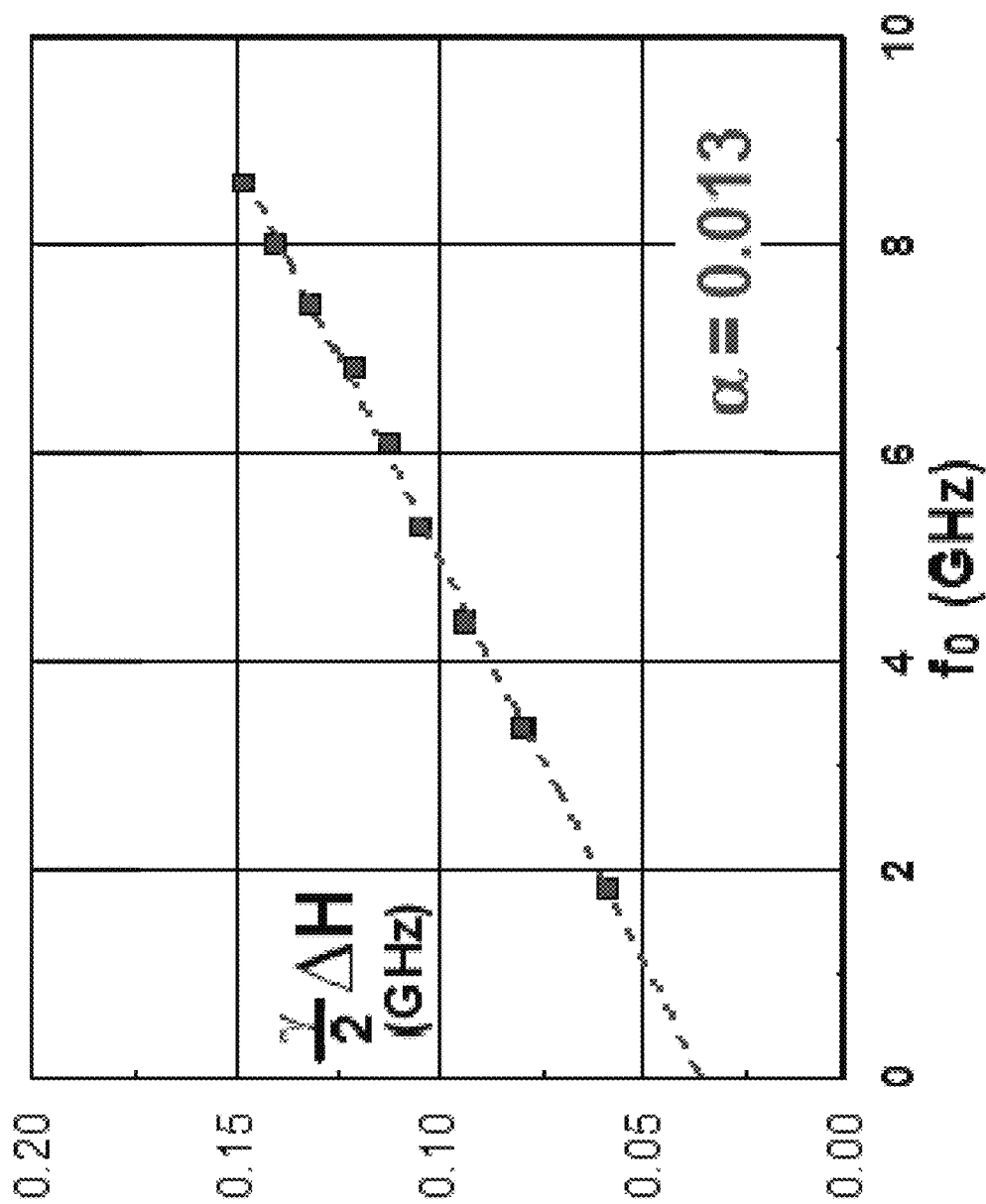
FIGS. 11, 12 and 13 are plots which illustrate a dependence of γΔH/2 as a function of the frequency during a ferromagnetic resonance measurement according to embodiments of the present disclosure.
Figure 12:
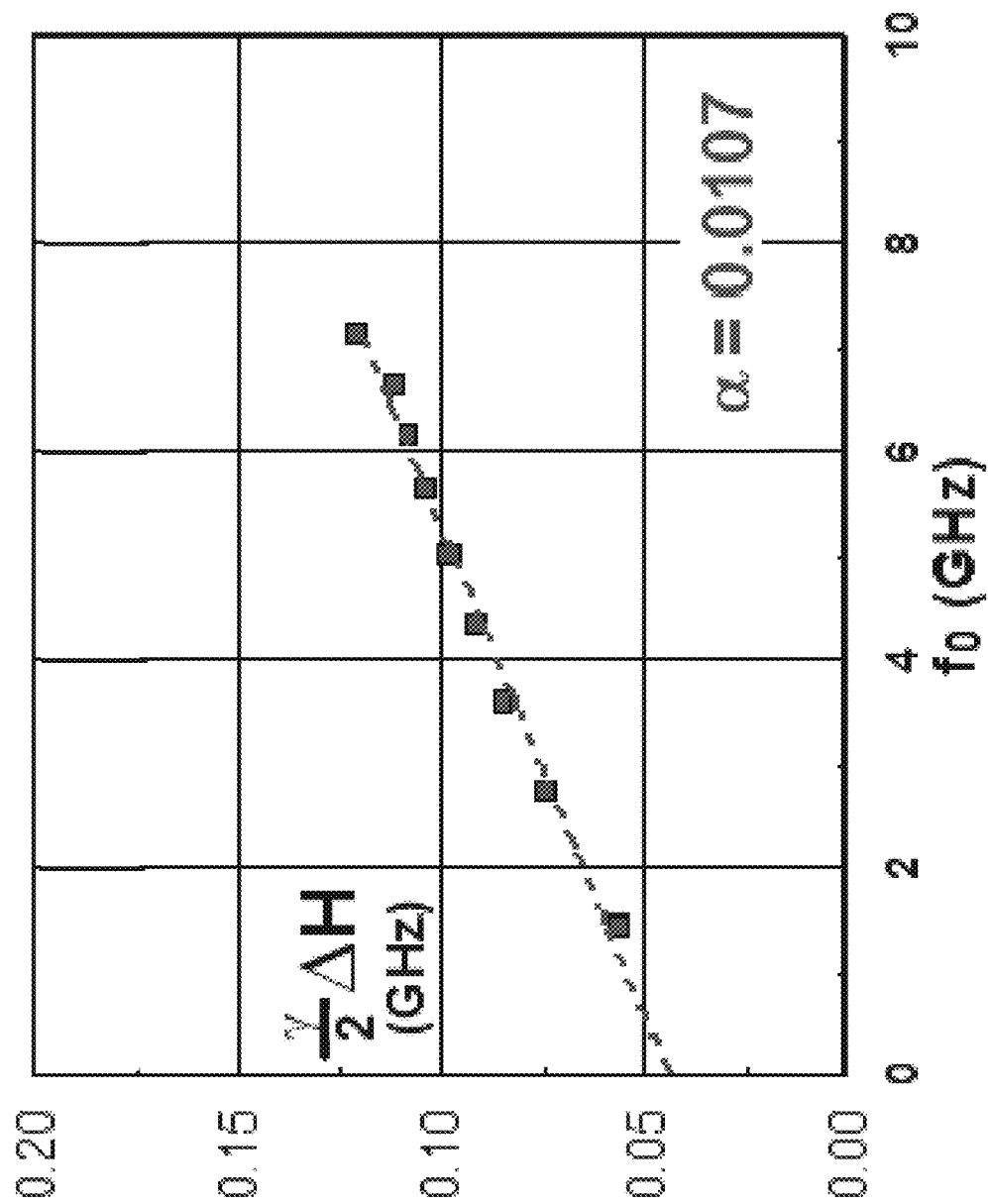
Figure 13:
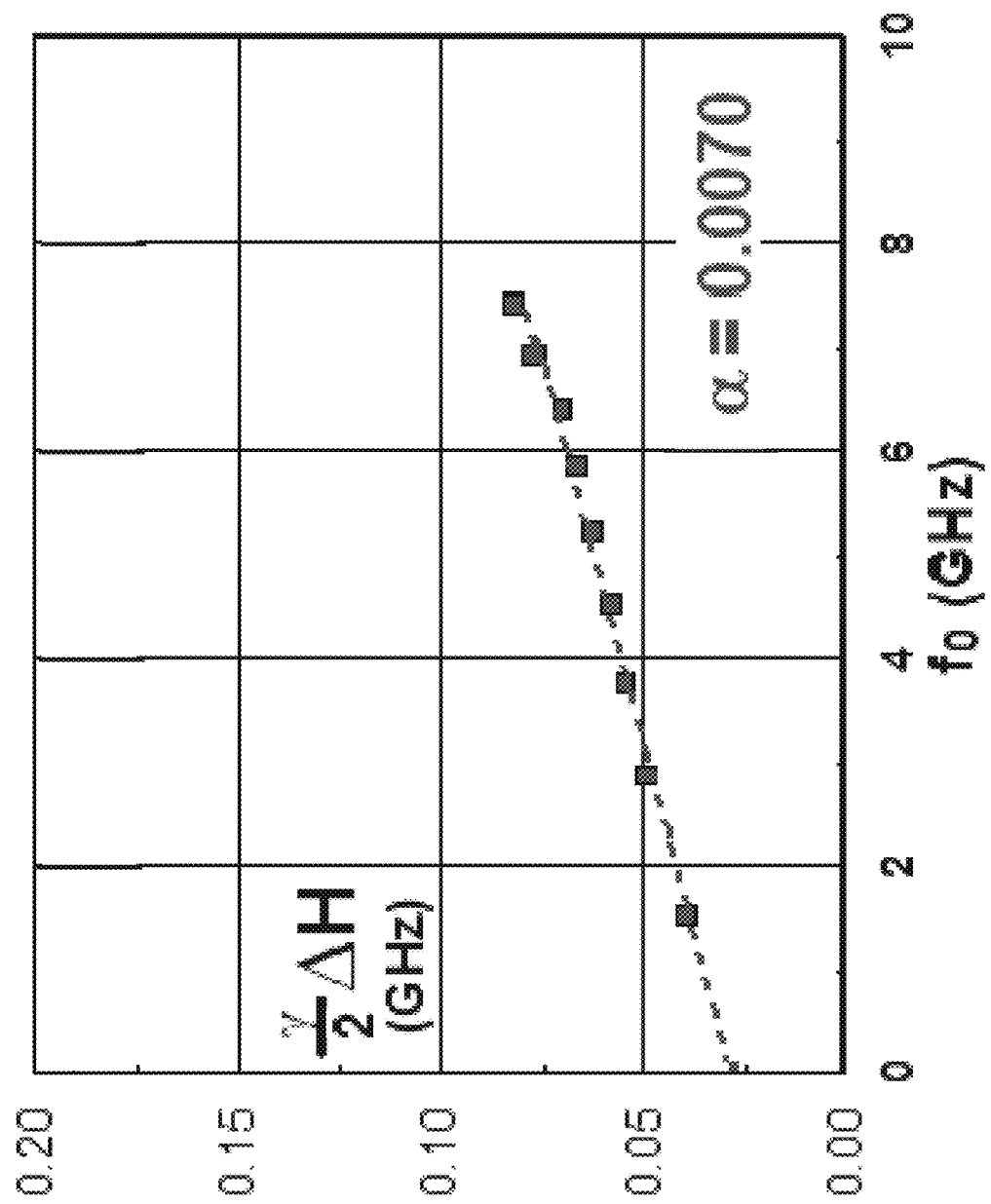

FIGS. 11-13 illustrate the dependence of γΔH/2 as a function of the frequency during a ferromagnetic resonance measurement on first, second, and third exemplary films, respectively. The first exemplary film, which is characterized in FIG. 11, includes 8 repetitions of a unit including a 1 nm thick beta phase tungsten layer and a 0.2 nm thick ruthenium layer, and a 1 nm thick beta phase tungsten cap layer according to an embodiment of the present disclosure. The second exemplary film, which is characterized in FIG. 12, includes 5 repetitions of a unit including a 1.5 nm thick beta phase tungsten layer and a 0.2 nm thick ruthenium layer, a 1 nm thick beta phase tungsten cap layer, a 0.2 nm thick ruthenium layer, and a 1 nm thick hafnium layer according to an embodiment of the present disclosure. The third exemplary film, which is characterized in FIG. 13, includes 5 repetitions of a unit including a 1.5 nm thick beta phase tungsten layer and a 0.2 nm thick ruthenium layer, a 1 nm thick beta phase tungsten cap layer, a 0.2 nm thick ruthenium layer, a 0.5 nm thick first hafnium layer, a hafnium oxide layer, and a 0.5 nm thick second hafnium layer according to an embodiment of the present disclosure. Thus, the first sample of FIG. 11 represents the configuration of the first, second and seventh exemplary SOT magnetoresistive memory cells (100, 200, 700), the second sample of FIG. 12 represents the configuration of the third, fourth and eighth exemplary SOT magnetoresistive memory cells (300, 400, 800), and third sample represents the configuration of the fifth, sixth and ninth exemplary SOT magnetoresistive memory cells (500, 600, 900) of the present disclosure.

In FIGS. 11-13, the slope of the fit lines represents the damping constant α. The values for the damping constant α are 0.013, 0.0107, and 0.007 for the first, second, and third samples, respectively. While the damping constant α provides improvement over prior art devices, the reduction of the damping constant α in the second sample with respect to the damping constant α in the first sample represents additional improvement in reducing the critical switching current. In addition, the reduction of the damping constant α in the third sample with respect to the damping constant α in the second sample represents further improvement in reducing the critical switching current.

The spin orbit torque memory cells of the present disclosure can be arranged in a randomly accessible configuration. According to one embodiment of the present disclosure, a spin orbit torque magnetoresistive random access memory (SOT MRAM) cell is provided. The SOT MRAM can comprise: a magnetic tunnel junction 101 that includes a free layer 104 having primarily two bi-stable magnetization directions, a reference layer 108 having a fixed magnetization direction, and a tunnel barrier layer 106 positioned between the free layer 104 and the reference layer 108. The SOT MRAM cell also contains a nonmagnetic spin Hall effect layer 204. In one embodiment, the spin Hall effect layer 204 comprises an alternating stack of beta phase tungsten layers 10 and noble metal nonmagnetic dusting layers 20. In another embodiment, a hafnium layer (60 or 61) is located between the nonmagnetic spin Hall effect layer 204 and the free layer 104 in addition to or instead of the alternating stack (10, 20).

In one embodiment, the free layer 104 is located between the tunnel barrier layer 106 and the nonmagnetic spin Hall effect layer 204. In one embodiment, the nonmagnetic dusting layers 20 comprise ruthenium layers or platinum layers and the tunnel barrier layer 106 comprises a MgO layer.

In one embodiment, each of the beta phase tungsten layers 10 has a thickness in a range from 0.2 nm to 1.2 nm; and each of the nonmagnetic dusting layers 20 has a thickness in a range from 0.1 nm to 0.3 nm. In one embodiment, the alternating stack includes N periodic repetitions of a pair of a beta phase tungsten layer 10 and a nonmagnetic dusting layer 20, and N is an integer in a range from 5 to 30. In one embodiment, the ratio of the thickness of the beta phase tungsten layer 10 within the pair to the thickness of the nonmagnetic dusting layer 20 within the pair is in a range from 3 to 6.

In one embodiment, the SOT MRAM cell can further comprise a first hafnium layer (60 or 61) located between the nonmagnetic spin Hall effect layer 204 and the free layer 104 of the magnetic tunnel junction 101. In one embodiment, the SOT MRAM cell further comprises a nonmagnetic spacer layer 40 located between the first hafnium layer (60 or 61) and the nonmagnetic spin Hall effect layer 204. The nonmagnetic spacer layer 40 may contact the first hafnium layer (60 or 61). In one embodiment, the first hafnium layer (60 or 61) has a thickness in a range from 0.4 nm to 1.5 nm, and the nonmagnetic spacer layer 40 has a thickness in a range from 0.1 nm to 0.4 nm.

In one embodiment, the SOT MRAM cell further comprises a hafnium oxide layer 55 located between the first hafnium layer 61 and the free layer 104 of the magnetic tunnel junction 101. In one embodiment, the SOT MRAM cell further comprises a second hafnium layer 62 located between the hafnium oxide layer 55 and the free layer 104 of the magnetic tunnel junction 101. In one embodiment, the first hafnium layer 61 has a thickness in a range from 0.3 nm to 1 nm; the hafnium oxide layer 55 has a thickness in a range from 0.1 nm to 0.5 nm; and the second hafnium layer 62 has a thickness in a range from 0.3 nm to 1 nm.

As described above, each of the SOT MRAM cells (100 to 900) is a three terminal device comprising a first terminal 1 electrically connected to a hard magnet layer 112 positioned on the reference layer side 108 of the magnetic tunnel junction 101, a second terminal 2 directly or indirectly electrically connected to a first end of the nonmagnetic spin Hall effect layer 204, and a third terminal 3 directly or indirectly electrically connected to a second end of the nonmagnetic spin Hall effect layer 204. The SOT MRAM cell is configured to generate a read current that flows between the first terminal 1 and the third terminal 3 through tunnel junction 101 during a sensing operation. The SOT MRAM cell is also configured to generate a write current that flows between the second terminal 2 and the third terminal 3 during a programming operation, such that the write current does not flow through the tunnel junction 101, and such that the read and write currents flow in different directions during the respective sensing and programming operations.

In one embodiment, the SOT MRAM cell (100, 200, 300, 400, 500, 600) further comprises a ferromagnetic bias layer 206 configured to provide spin orbit torque via anomalous Hall effect and to provide a magnetic bias field on the free layer 104 to achieve deterministic switching and an antiferromagnetic (AFM) layer 202 positioned adjacent to the ferromagnetic bias layer 206 and configured to pin a magnetization direction of the ferromagnetic bias layer 206 in a pre-determined direction. In these embodiments, the second terminal 2 is electrically connected to the first end of the AFM layer 202 and the third terminal 3 is electrically connected to a second end of the AFM layer 202, such that the second and the third terminals (2, 3) are indirectly electrically connected to the respective first and second ends of the nonmagnetic spin Hall effect layer 204.

In another embodiment the SOT MRAM cell (700, 800, 900) includes at least one permanent magnet 120 located adjacent to the tunnel junction 101, and layers 202 and 206 are omitted. In these embodiments, the second and the third terminals (2, 3) are directly electrically connected to the respective first and second ends of the nonmagnetic spin Hall effect layer 204.

The various SOT MRAM cells of the present disclosure provides non-limiting advantages through the alternating stacks of the nonmagnetic spin Hall effect layer 204 and/or the intervening layers between the nonmagnetic spin Hall effect layer 204 and the free layer 104. The laminated multilayer structure with tight control of thickness ratios between the beta phase tungsten layers 10 and the nonmagnetic dusting layers 20 ensures thermally stable beta phase tungsten material with high spin Hall angle, which is three times as high as the spin Hall angle of platinum. Insertion of the hafnium layer between the nonmagnetic spin Hall effect layer 204 and the free layer 104 increases interfacial perpendicular anisotropy, and thus, reduces the out-of-plane stiffness field. The reduction can be on the order of about 28%. In addition, the damping constant α can be reduced by insertion of a hafnium oxide layer 55. A damping constant α of 0.0070 is about 25% of the lowest damping constant of a prior art device employing platinum for a nonmagnetic spin Hall effect layer 204. It is believed that the combination of the various features of the present disclosure can provide a critical switching current that is only 20% of the critical switching current of a prior art SOT memory cell employing platinum spin Hall effect layer 204.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A spin orbit torque magnetoresistive random access memory (SOT MRAM) cell, comprising:
   a magnetic tunnel junction that comprises a free layer having two bi-stable magnetization directions, a reference magnetic layer having a fixed magnetization direction, and a tunnel barrier layer located between the free layer and the reference layer;
   a nonmagnetic spin Hall effect layer comprising an alternating stack of beta phase tungsten layers and noble metal nonmagnetic dusting layers; and
   at least one feature selected from:
      a first feature that the free layer is located between the tunnel barrier layer and the nonmagnetic spin Hall effect layer, the nonmagnetic dusting layers comprise ruthenium, platinum, iridium, palladium, rhodium, rhenium or osmium layers, the tunnel barrier layer comprises a MgO layer; each of the beta phase tungsten layers has a thickness in a range from 0.2 nm to 1.2 nm, and each of the nonmagnetic dusting layers has a thickness in a range from 0.1 nm to 0.3 nm;
      a second feature that the free layer is located between the tunnel barrier layer and the nonmagnetic spin Hall effect layer, the nonmagnetic dusting layers comprise ruthenium, platinum, iridium, palladium, rhodium, rhenium or osmium layers, and the alternating stack includes N periodic repetitions of a pair of the beta phase tungsten layer and the nonmagnetic dusting layer, and wherein N is an integer in a range from 5 to 30;
      a third feature that the SOT MRAM cell further comprises a first hafnium layer located between the nonmagnetic spin Hall effect layer and the free layer, and a nonmagnetic spacer layer located between the first hafnium layer and the nonmagnetic spin Hall effect layer and comprising a material selected from ruthenium and platinum, wherein the nonmagnetic spacer layer contacts the first hafnium layer; or a fourth feature that the SOT MRAM cell further comprises a first hafnium layer located between the nonmagnetic spin Hall effect layer and the free layer, and a hafnium oxide layer located between the first hafnium layer and the free layer, and a second hafnium layer located between the hafnium oxide layer and the free layer.

2. The SOT MRAM cell of claim 1, wherein the SOT MRAM cell comprises the first feature.

3. The SOT MRAM cell of claim 1, wherein the SOT MRAM cell comprises the second feature.

4. The SOT MRAM cell of claim 3, wherein a ratio of a thickness of the beta phase tungsten layer to a thickness of the nonmagnetic dusting layer is in a range from 3 to 6.

5. The SOT MRAM cell of claim 1, wherein the SOT MRAM cell comprises the third feature.

6. The SOT MRAM cell of claim 1, wherein the SOT MRAM cell comprises the fourth feature.

7. A spin orbit torque magnetoresistive random access memory (SOT MRAM) cell, comprising:
a magnetic tunnel junction that comprises a free layer having two bi-stable magnetization directions, a reference magnetic layer having a fixed magnetization direction, and a tunnel barrier layer located between the free layer and the reference layer; and
a nonmagnetic spin Hall effect layer comprising an alternating stack of beta phase tungsten layers and noble metal nonmagnetic dusting layers,
wherein:
the SOT MRAM cell is a three terminal device comprising a first terminal electrically connected to a hard magnet layer positioned on the reference layer side of the magnetic tunnel junction, a second terminal directly or indirectly electrically connected to a first end of the nonmagnetic spin Hall effect layer, and a third terminal directly or indirectly electrically connected to a second end of the nonmagnetic spin Hall effect layer;
the SOT MRAM cell is configured to generate a read current that flows between the first terminal and the third terminal through tunnel junction during a sensing operation; and
the SOT MRAM cell is configured to generate a write current that flows between the second terminal and the third terminal during a programming operation, such that the write current does not flow through the tunnel junction, and such that the read and write currents flow in different directions during the respective sensing and programming operations; and
at least one feature selected from:
a first feature that the SOT MRAM cell further comprises a ferromagnetic bias layer configured to provide spin orbit torque via anomalous Hall effect and to provide a magnetic bias field on the free layer to achieve deterministic switching, and an antiferromagnetic (AFM) layer located adjacent to the ferromagnetic bias layer and configured to pin a magnetization direction of the ferromagnetic bias layer in a pre-determined direction, wherein the second terminal is electrically connected to the first end of the AFM layer and the third terminal is electrically connected to a second end of the AFM layer, such that the second and the third terminals are indirectly electrically connected to the respective first and second ends of the nonmagnetic spin Hall effect layer; or a second feature that the SOT MRAM cell further comprises at least one permanent magnet located adjacent to the magnetic tunnel junction, wherein the second and the third terminals are directly electrically connected to the respective first and second ends of the nonmagnetic spin Hall effect layer.

8. The SOT MRAM cell of claim 7, wherein the SOT MRAM cell comprises the first feature.

9. The SOT MRAM cell of claim 7, wherein the SOT MRAM cell comprises the second feature.

10. A spin orbit torque magnetoresistive random access memory (SOT MRAM) cell, comprising:
a magnetic tunnel junction that comprises a free layer having two bi-stable magnetization directions, a reference magnetic layer having a fixed magnetization direction, and a tunnel barrier layer located between the free layer and the reference layer;
a nonmagnetic spin Hall effect layer;
a first hafnium layer located between the nonmagnetic spin Hall effect layer and the free layer; and
at least one feature selected from:
a first feature that the nonmagnetic spin Hall effect layer comprises an alternating stack of beta phase tungsten layers and ruthenium, platinum, iridium, palladium, rhodium, rhenium or osmium nonmagnetic dusting layers, each of the beta phase tungsten layers has a thickness in a range from 0.2 nm to 1.2 nm, and each of the nonmagnetic dusting layers has a thickness in a range from 0.1 nm to 0.3 nm;
a second feature that the SOT MRAM cell further comprises a nonmagnetic spacer layer located between the first hafnium layer and the nonmagnetic spin Hall effect layer and comprising a material selected from ruthenium and platinum, wherein the nonmagnetic spacer layer contacts the first hafnium layer;
a third feature that:
the SOT MRAM cell is a three terminal device comprising a first terminal electrically connected to a hard magnet layer positioned on the reference layer side of the magnetic tunnel junction, a second terminal directly or indirectly electrically connected to a first end of the nonmagnetic spin Hall effect layer, and a third terminal directly or indirectly electrically connected to a second end of the nonmagnetic spin Hall effect layer;
the SOT MRAM cell is configured to generate a read current that flows between the first terminal and the third terminal through tunnel junction during a sensing operation;
the SOT MRAM cell is configured to generate a write current that flows between the second terminal and the third terminal during a programming operation, such that the write current does not flow through the tunnel junction, and such that the read and write currents flow in different directions during the respective sensing and programming operations;
the SOT MRAM cell further comprises a ferromagnetic bias layer configured to provide spin orbit torque via anomalous Hall effect and to provide a magnetic bias field on the free layer to achieve deterministic switching, and an antiferromagnetic (AFM) layer located adjacent to the ferromagnetic bias layer and configured to pin a magnetization direction of the ferromagnetic bias layer in a pre-determined direction; and the second terminal is electrically connected to the first end of the AFM layer and the third terminal is electrically connected to a second end of the AFM layer, such that the second and the third terminals are indirectly electrically connected to the respective first and second ends of the nonmagnetic spin Hall effect layer; or a fourth feature that:

the SOT MRAM cell is a three terminal device comprising a first terminal electrically connected to a hard magnet layer positioned on the reference layer side of the magnetic tunnel junction, a second terminal directly or indirectly electrically connected to a first end of the nonmagnetic spin Hall effect layer, and a third terminal directly or indirectly electrically connected to a second end of the nonmagnetic spin Hall effect layer;

the SOT MRAM cell is configured to generate a read current that flows between the first terminal and the third terminal through tunnel junction during a sensing operation;

the SOT MRAM cell is configured to generate a write current that flows between the second terminal and the third terminal during a programming operation, such that the write current does not flow through the tunnel junction, and such that the read and write currents flow in different directions during the respective sensing and programming operations; and the SOT MRAM cell further comprises at least one permanent magnet located adjacent to the magnetic tunnel junction, wherein the second and the third terminals are directly electrically connected to the respective first and second ends of the nonmagnetic spin Hall effect layer.

11. The SOT MRAM cell of claim 10, wherein:

the free layer is located between the tunnel barrier layer and the nonmagnetic spin Hall effect layer;

the nonmagnetic spin Hall effect layer comprises at least one beta phase tungsten layer; and the tunnel barrier layer comprises a MgO layer.

12. The SOT MRAM cell of claim 10, wherein the SOT MRAM cell comprises the first feature.

13. The SOT MRAM cell of claim 12, wherein:

the alternating stack includes N periodic repetitions of a pair of the beta phase tungsten layer and the nonmagnetic dusting layer, and wherein N is an integer in a range from 5 to 30; and a ratio of a thickness of the beta phase tungsten layer to a thickness of the nonmagnetic dusting layer is in a range from 3 to 6.

14. The SOT MRAM cell of claim 10, wherein the SOT MRAM cell comprises the second feature.

15. The SOT MRAM cell of claim 14, further comprising a hafnium oxide layer located between the first hafnium layer and the free layer, and a second hafnium layer located between the hafnium oxide layer and the free layer.

16. The SOT MRAM cell of claim 10, wherein the SOT MRAM cell comprises the third feature.

17. The SOT MRAM cell of claim 10, wherein the SOT MRAM cell comprises the fourth feature.

* * * * *